United States Patent
Sasaki et al.

(10) Patent No.: US 10,396,276 B2
(45) Date of Patent: Aug. 27, 2019

(54) ELECTRIC-CURRENT-GENERATED MAGNETIC FIELD ASSIST TYPE SPIN-CURRENT-INDUCED MAGNETIZATION REVERSAL ELEMENT, MAGNETORESISTANCE EFFECT ELEMENT, MAGNETIC MEMORY AND HIGH-FREQUENCY FILTER

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/708,747

(22) Filed: Sep. 19, 2017

(65) Prior Publication Data
US 2018/0123026 A1     May 3, 2018

(30) Foreign Application Priority Data

Oct. 27, 2016 (JP) .................................. 2016-210536
Jul. 14, 2017 (JP) .................................. 2017-138385

(51) Int. Cl.
*G11C 11/16*     (2006.01)
*H03H 7/06*     (2006.01)
(Continued)

(52) U.S. Cl.
CPC ............ *H01L 43/08* (2013.01); *G11C 11/161* (2013.01); *G11C 11/1653* (2013.01);
(Continued)

(58) Field of Classification Search
CPC .... H01L 43/08; G11C 11/161; G11C 11/1653
(Continued)

(56) References Cited

U.S. PATENT DOCUMENTS 8,350,347 B2    1/2013   Gaudin et al.
9,824,735 B1*   11/2017   Kan ..................... G11C 11/161
(Continued)

FOREIGN PATENT DOCUMENTS

WO     2016/021468 A1    2/2016

OTHER PUBLICATIONS

Miron, Ioan Mihai, et al., "Perpendicular switching of a single ferromagnetic layer induced by in-plane current injection.", Nature, pp. 189-192, vol. 476, (2011).
(Continued)

*Primary Examiner* — Anthan Tran
(74) *Attorney, Agent, or Firm* — Oliff PLC

(57) ABSTRACT

The present invention has the purpose of providing an electric-current-generated magnetic field assist type spin-current-induced magnetization reversal element that utilizes magnetization reversal based on pure spin current. The electric-current-generated magnetic field assist type spin-current-induced magnetization reversal element of the present invention includes a first ferromagnetic metal layer with a varying magnetization direction; spin-orbit torque wiring that adjoins the first ferromagnetic metal layer and that extends in a second direction in a plane orthogonal to a first direction normal to the first ferromagnetic metal layer; and electric-current-generated magnetic field assist wiring that is arranged so as to be electrically insulated from the first ferromagnetic metal layer by an insulating layer and in which flows an electric current $I_0$ for forming a magnetic field $H_0$ that assists magnetization reversal of the first ferromagnetic metal layer.

16 Claims, 9 Drawing Sheets

(51) Int. Cl.
  *H01L 43/08* (2006.01)
  *H01F 10/32* (2006.01)
  *H01L 27/22* (2006.01)
  *H01L 43/02* (2006.01)
  *H03H 11/04* (2006.01)

(52) U.S. Cl.
  CPC ....... *H01F 10/329* (2013.01); *H01F 10/3286* (2013.01); *H01L 27/222* (2013.01); *H01L 43/02* (2013.01); *H03H 7/06* (2013.01); *H03H 11/04* (2013.01)

(58) Field of Classification Search
  USPC .......................................................... 365/158
  See application file for complete search history.

(56) References Cited

U.S. PATENT DOCUMENTS

| | | | | |
|---|---|---|---|---|
| 2011/0038080 A1* | 2/2011 | Alex | ........................ | G11B 5/02 360/123.02 |
| 2012/0250404 A1* | 10/2012 | Wang | .................... | G11C 11/161 365/171 |
| 2015/0348606 A1 | 12/2015 | Buhrman et al. | | |
| 2017/0222135 A1 | 8/2017 | Fukami et al. | | |

OTHER PUBLICATIONS

Fukami, S. et al., "A spin-orbit torque switching scheme with collinear magnetic easy axis and current configuration,", Nature NanoTechnology, DOI: 10.1038/NNANO.2016.29, pp. 1-6, (2016).
Kato Y.K. et al., "Observation of the Spin Hall Effect in Semiconductors.", www.sciencemag.org, pp. 1910-1913, vol. 306, (2004).
Liu, Luqiao et al., "Spin torque switching with the giant spin Hall effect of tantalum.", https://arxiv.org/abs/1203.2875, pp. 1-19, (2012).
Liu, Luqiao et al., "Current-Induced Switching of Perpendicularly Magnetized Magnetic Layers Using Spin Torque from the Spin Hall Effect.", Physical Review Letters, American Physical Society, pp. 096602-1 to 096602-5, vol. 109, (2012).
Lee, Ki-Seung et al., "Threshold current for switching of a perpendicular magnetic layer induced by spin Hall effect.", Applied Physics Letters, https://arxiv.org/abs/1210.3442, pp. 1-17, (2013).
Lee, Ki-seung et al., "Thermally activated switching of perpendicular magnet by spin-orbit spin torque.", Applied Physics Letters, pp. 072413-1 to 072413-5, vol. 104, (2014).
Fukami, Shunsuke et al., "Magnetization switching by spin-orbit torque in an antiferromagnet-ferromagnet bilayer system.", Nature Materials, pp. 535-541, vol. 15, (2016).
Takahashi, S. et al., "Spin injection and detection in magnetic nanostructures.", Physical Review, pp. 052409-1 to 502409-4, vol. B67, (2003).
Seo, Yeongkyo et al., "Area-Efficient SOT-MRAM With a Schottky Diode.", IEEE Electron Device Letters, pp. 982-985, vol. 37, No. 8, (2016).

* cited by examiner

FIG. 9
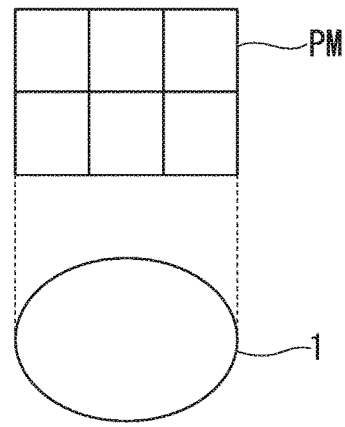
(a)
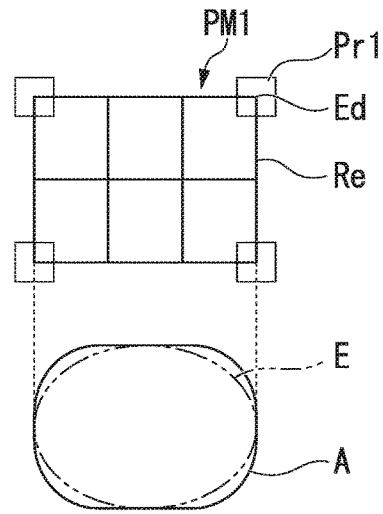
(b)
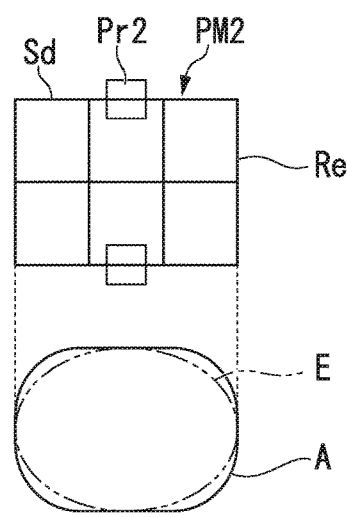
(c)

ELECTRIC-CURRENT-GENERATED MAGNETIC FIELD ASSIST TYPE SPIN-CURRENT-INDUCED MAGNETIZATION REVERSAL ELEMENT, MAGNETORESISTANCE EFFECT ELEMENT, MAGNETIC MEMORY AND HIGH-FREQUENCY FILTER

BACKGROUND OF THE INVENTION

Field of Invention

The present invention relates to an electric-current-generated magnetic field assist type spin-current-induced magnetization reversal element, a magnetoresistance effect element, a magnetic memory and a high-frequency filter.

Description of Related Art

Giant magnetoresistance (GMR) elements, which are composed of multilayer films of ferromagnetic metal layers and non-magnetic layers, and tunnel magnetoresistance (TMR) elements, which use insulating layers (tunnel barrier layers, barrier layers) as non-magnetic layers, are known. Generally, TMR elements have higher element resistance than GMR elements, but also have higher magnetoresistance (MR) ratios than GMR elements. Therefore, TMR elements are attracting attention as elements for use in magnetic sensors, high-frequency components, magnetic heads and non-volatile random access memory (MRAM).

Examples of known methods for writing to MRAM include a method in which a magnetic field generated by an electric current is used to perform writing (magnetization reversal), and a method in which a spin transfer torque (STT) generated by passing an electric current through the stacking direction of a magnetoresistance effect element is used to perform writing (magnetization reversal).

In the method using a magnetic field, if the element size is small, there is a problem in that writing cannot be performed with the electric currents that are able to flow through thin wiring.

On the other hand, in the method using spin-transfer torque (STT), one ferromagnetic metal layer (fixed layer, reference layer) causes spin polarization of the electric current, the spin of the electric current is transferred to magnetization of the other ferromagnetic metal layer (free layer, memory layer), and writing (magnetization reversal) is performed by the torque (STT) generated at that time. For this reason, the method using STT has the advantage that less electric current is needed for writing as the element size becomes smaller.

RELATED LITERATURE

Non-Patent Documents

Non-Patent Document 1:
I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).
Non-Patent Document 2:
S. Fukami, T. Anekawa, C. Zhang, and H. Ohno, Nature Nanotechnology, DOI:10.1038/NNANO.2016.29.

BRIEF SUMMARY OF THE INVENTION

The magnetization reversal of TMR elements using STT is efficient from the viewpoint of energy efficiency. However, the reversal current density needed for performing magnetization reversal in TMR elements using STT is high. For the purpose of prolonging the life of TMR elements, it is desirable for this reversal current density to be low. This similarly applies to GMR elements.

Additionally, when inducing magnetization reversal in order to write information into a TMR element, it is necessary to supply a sufficiently larger electric current than that used during reading. From the viewpoint of the durability of TMR elements, it is desirable for the electric current applied to TMR elements when writing information into the TMR elements to be low.

Therefore, in magnetoresistance effect elements, whether TMR elements or GMR elements, it is desirable to lower the current density flowing to the magnetoresistance effect elements.

In recent years, much attention has been focused on magnetization reversal that utilizes pure spin current generated by the spin Hall effect as a means for reducing the reversal current by a mechanism different from STT (for example, Non-Patent Document 1). Pure spin current generated by the spin Hall effect or the Rashba effect at the interface between heterologous materials induces spin-orbit torque (SOT), and depending on the intensity of the SOT, magnetization reversal occurs. A pure spin current is generated when the same number of electrons with upward spin and electrons with downward spin flow in opposite directions, in which case the flow of charge cancels out and the electric current becomes zero. If magnetization reversal can be performed using only this pure spin current, then the electric current flowing through the magnetoresistance effect element will be zero, so the life of the magnetoresistance effect element can be prolonged.

SOT-MRAM is a magnetic memory comprising, as memory cells, magnetoresistance effect elements that can perform magnetization reversal by introducing a pure spin current from spin-orbit torque wiring to a ferromagnetic metal layer. There is no need to supply an electric current to the tunnel barrier layer in this magnetoresistance effect element. The pure spin current is introduced through the junction surface between the magnetoresistance effect element and the spin-orbit torque wiring. Therefore, the spin injection efficiency into the ferromagnetic metal layer is determined by the current density in the spin-orbit torque wiring. In a magnetoresistance effect element having the direction of extension of the spin-orbit torque wiring as the long axis (the electric current flowing in the direction of extension), the reversal current density of the magnetoresistance effect element will not change even if the length of the long axis of the magnetoresistance effect element changes.

Non-Patent Document 2 describes three types of magnetization reversal elements using SOT, the types differing based on the relationship between the direction of the electric current flowing through the spin-orbit torque wiring and the direction of a magnetization-easy axis of the ferromagnetic metal layer (free magnetization layer). For cases in which the direction of the electric current and the direction of the magnetization-easy axis are orthogonal, a configuration in which the ferromagnetic metal layer is composed of a perpendicularly magnetized film is of "type z", and a configuration in which the ferromagnetic metal layer is composed of an in-plane magnetized film is of "type y". Furthermore, a configuration in which the ferromagnetic metal layer is composed of an in-plane magnetized film and the direction of the electric current is parallel to the direction of the magnetization-easy axis is of "type x".

The present invention was made in consideration of the above-mentioned problems, and has the purpose of providing an electric-current-generated magnetic field assist type spin-current-induced magnetization reversal element, a magnetoresistance effect element, a magnetic memory and a high-frequency filter utilizing magnetization reversal based on pure spin current.

In order to solve the above-mentioned problems, the present invention has the following features.

(1) The electric-current-generated magnetic field assist type spin-current-induced magnetization reversal element according to a first embodiment of the present invention comprises: a first ferromagnetic metal layer with a varying magnetization direction; spin-orbit torque wiring that adjoins the first ferromagnetic metal layer and that extends in a second direction in a plane orthogonal to a first direction normal to the first ferromagnetic metal layer; and electric-current-generated magnetic field assist wiring that is arranged so as to be electrically insulated from the first ferromagnetic metal layer and in which flows an electric current for forming a magnetic field that assists magnetization reversal of the first ferromagnetic metal layer.

(2) In the electric-current-generated magnetic field assist type spin-current-induced magnetization reversal element according to (1) above, the electric-current-generated magnetic field assist wiring may extend in a third direction in a plane orthogonal to the first direction.

(3) In the electric-current-generated magnetic field assist type spin-current-induced magnetization reversal element according to (2) above, the direction of extension of the electric-current-generated magnetic field assist wiring may extend orthogonal or parallel to the direction of extension of the spin-orbit torque wiring.

However, the direction of extension of the electric-current generated magnetic field assist wiring is not limited to being "orthogonal or parallel" to the direction of extension of the spin-orbit torque wiring. The applied magnetic field that is applied from the electric-current-generated magnetic field assist wiring during magnetization reversal by SOT has the function of supporting the starting or stopping of magnetization reversal. For this reason, it is sufficient for the applied magnetic field to act so that the direction of the spin injected by the spin current is not orthogonal to the direction of magnetization of the ferromagnetic metal layer, so that the spin current can apply torque for the magnetization of the first ferromagnetic metal layer. Therefore, while the applied magnetic field will contribute to magnetization reversal with maximum efficiency if the direction of extension of the electric-current-generated magnetic field assist wiring is "orthogonal or parallel" to the direction of extension of the spin-orbit torque wiring, it is still effective even when not "orthogonal or parallel".

(4) In the electric-current-generated magnetic field assist type spin-current-induced magnetization reversal element according to (3) above, the direction of extension of the spin-orbit torque wiring may be orthogonal to a direction of a magnetization-easy axis of the first ferromagnetic metal layer.

(5) In the electric-current-generated magnetic field assist type spin-current-induced magnetization reversal element according to (4) above, the direction of the magnetization-easy axis of the first ferromagnetic metal layer may be the direction normal thereto.

(6) In the electric-current-generated magnetic field assist type spin-current-induced magnetization reversal element according to any one of (1) to (5) above, the first ferromagnetic metal layer, in plan view, may have shape anisotropy such that a long axis is oriented in the second direction, which is the direction of extension of the spin-orbit torque wiring.

(7) In the electric-current-generated magnetic field assist type spin-current-induced magnetization reversal element according to any one of (1) to (6) above, the electric-current-generated magnetic field assist wiring may comprise a magnetic shield layer on a side surface and/or a surface on a side not facing the first ferromagnetic metal layer.

(8) The electric-current-generated magnetic field assist type spin-current-induced magnetization reversal element according to any one of (1) to (7) above may have a plurality of lines of the electric-current-generated magnetic field assist wiring.

(9) The electric-current-generated magnetic field assist type spin-current-induced magnetization reversal element according to any one of (1) to (8) above may comprise a control device that implements control so as to supply an electric current to the spin-orbit torque wiring after supplying an electrical current to the electric-current-generated magnetic field assist wiring.

(10) The electric-current-generated magnetic field assist type spin-current-induced magnetization reversal element according to any one of (1) to (9) above may comprise a control device that implements control so as to stop supplying an electric current to the electric-current-generated magnetic field assist wiring after having stopped supplying an electric current to the spin-orbit torque wiring.

(11) A magnetoresistance effect element according to an embodiment of the present invention comprises the electric-current-generated magnetic field assist type spin-current-induced magnetization reversal element according to any one of (1) to (10) above, a second ferromagnetic metal layer with a fixed magnetization direction, and a non-magnetic layer sandwiched between the first ferromagnetic metal layer and the second ferromagnetic metal layer.

(12) A magnetic memory according to an embodiment of the present invention comprises a plurality of magnetoresistance effect elements according to (11) above.

(13) In the magnetic memory according to (12) above, the electric-current-generated magnetic field assist wiring, in plan view, may be provided between adjacent electric-current-generated magnetic field assist type spin-current-induced magnetization reversal elements.

(14) A high-frequency filter according to an embodiment of the present invention comprises the magnetoresistance effect element according to (11) above.

According to the electric-current-generated magnetic field assist type spin-current-induced magnetization reversal element of the present invention, it is possible to provide an electric-current-generated magnetic field assist type spin-current-induced magnetization reversal element that utilizes magnetization reversal based on pure spin current.

BRIEF DESCRIPTION OF THE DRAWINGS

FIG. 9 is a diagram illustrating the correspondence between the shape of a photomask and the planar shape of a resulting first ferromagnetic metal layer, when viewed from the z-direction.

DETAILED DESCRIPTION OF THE INVENTION

The present invention is described in detail below, with reference to the drawings as appropriate. The drawings used in the following description, in some cases, are illustrated with characteristic portions enlarged for convenience in order to facilitate comprehension of the characteristics of the present invention, and the dimensional ratios and the like between the constituent elements may differ from the actual values. Further, the materials and dimensions and the like presented in the following descriptions are merely examples, which are not intended to limit the present invention, and may be altered as appropriate within a range in which the effects of the present invention are achieved. The elements of the present invention may comprise other layers within a range in which the effects of the present invention are achieved.

(Electric-Current-Generated Magnetic Field Assist Type Spin-Current-Induced Magnetization Reversal Element)

Figure 1:
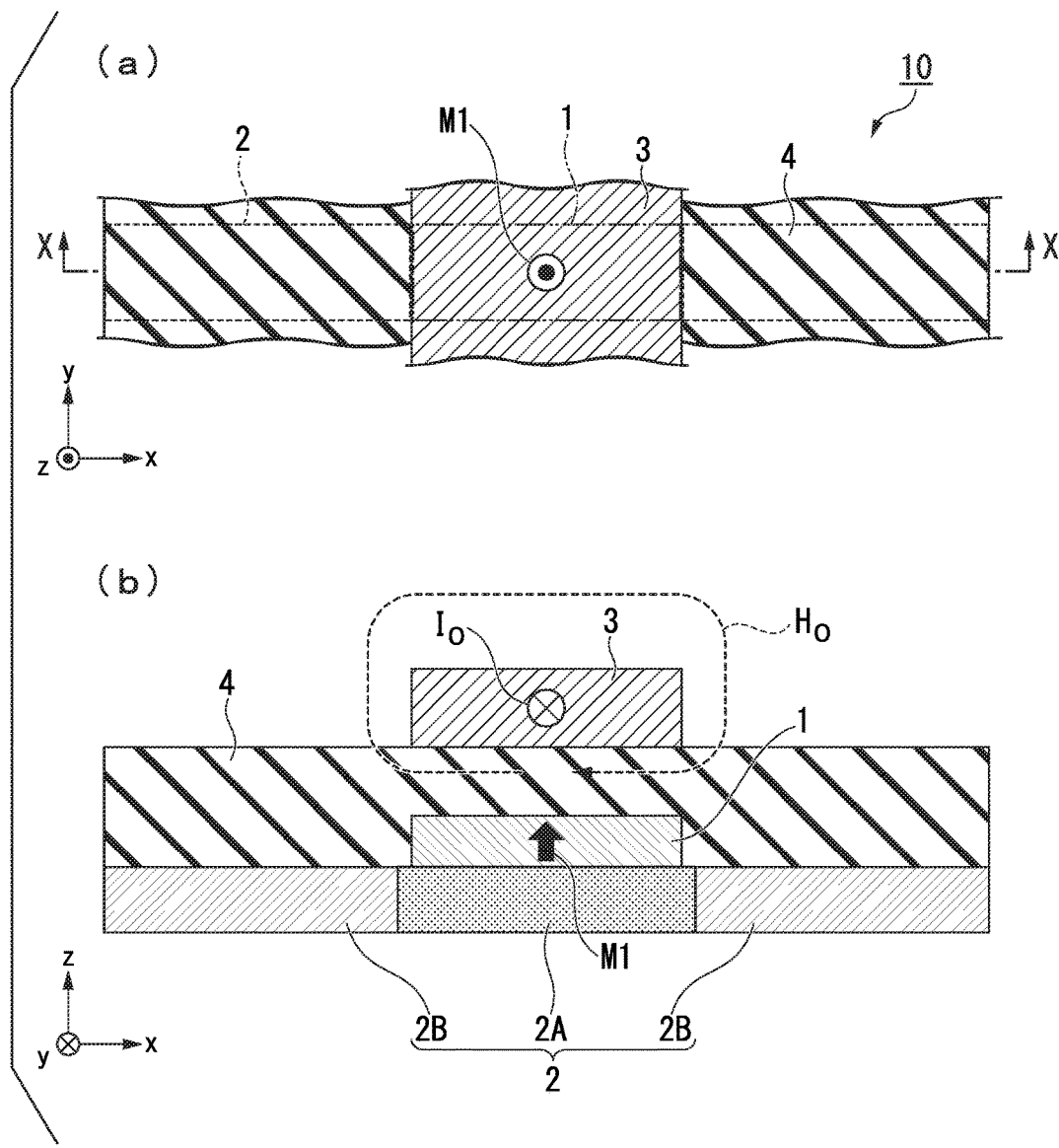
FIG. 1 illustrates schematic diagrams for explaining one embodiment of the electric-current-generated magnetic field assist type spin-current-induced magnetization reversal element according to the present invention, wherein (a) is a plan view and (b) is a section view.

FIG. 1 illustrates a schematic view of one example of an electric-current-generated magnetic field assist type spin-current-induced magnetization reversal element according to an embodiment of the present invention. FIG. 1(a) is a plan view, and FIG. 1(b) is a section view cut along the line X-X, which is the center line, in the width direction, of the spin-orbit torque wiring 2 in FIG. 1(a). In FIG. 1(a), the first ferromagnetic metal layer 1 is indicated by a double-dotted chain line and the spin-orbit torque wiring 2 is indicated by a dashed line, in order to show the arrangement of the interior layers that cannot be seen in the plan view.

The electric-current-generated magnetic field assist type spin-current-induced magnetization reversal element 10 illustrated in FIG. 1 comprises a first ferromagnetic metal layer 1 with a varying magnetization direction, spin-orbit torque wiring 2 and electric-current-generated magnetic field assist wiring 3. The spin-orbit torque wiring 2 extends in a second direction that is in a plane orthogonal to a first direction that is normal to the first ferromagnetic metal layer 1, and adjoins the first ferromagnetic metal layer 1. Additionally, the electric-current-generated magnetic field assist wiring 3 is arranged so as to be electrically insulated from the first ferromagnetic metal layer 1 by an insulating layer 4. An electric current $I_0$ for forming a magnetic field $H_0$ that assists the magnetization reversal of the first ferromagnetic metal layer 1 flows through the electric-current-generated magnetic field assist wiring 3.

In the present embodiment, an electric current flows through the spin-orbit torque wiring in the direction of extension thereof.

In the electric-current-generated magnetic field assist spin-current-induced magnetization reversal element 10 illustrated in FIG. 1, the direction normal to the first ferromagnetic metal layer 1, i.e., the direction of stacking of the first ferromagnetic metal layer 1 and the spin-orbit torque wiring 2 (first direction), is parallel to the z-axis. The direction of extension of the spin-orbit torque wiring 2 (second direction) is parallel to the x-axis. The direction of extension of the electric-current-generated magnetic field assist wiring 3 (third direction) is parallel to the y-axis. In other words, the electric-current-generated magnetic field assist type spin-current-induced magnetization reversal element 10 illustrated in FIG. 1 is an example wherein the stacking direction of the first ferromagnetic metal layer 1 and the spin-orbit torque wiring 2 (first direction), the direction of extension of the spin-orbit torque wiring 2 (second direction) and the direction of extension of the electric-current-generated magnetic field assist wiring 3 (third direction) are orthogonal to each other.

In terms of the relationship between the direction of the magnetization-easy axis of the first ferromagnetic metal layer 1 and the direction of the electric current flowing in the spin-orbit torque wiring 2, the electric-current-generated magnetic field assist type spin-current-induced magnetization reversal element 10 illustrated in FIG. 1 corresponds to "type z" in Non-Patent Document 2.

In the electric-current-generated magnetic field assist type spin-current-induced magnetization reversal element 10 illustrated in FIG. 1, the magnetization M1 of the first ferromagnetic metal layer 1 is oriented in the +z direction. In other words, the direction of extension of the electric-current-generated magnetic field assist wiring 3 (third direction) is orthogonal to the direction of the magnetization-easy axis of the first ferromagnetic metal layer 1 (direction parallel to the z-axis).

In this case, when an electric current $J_0$ is supplied, from the −y direction towards the +y direction (from in front of the page through to the opposite side of the page in FIG. 1(b)), to the electric-current-generated magnetic field assist wiring 3 extending parallel to the y-axis, a magnetic field $H_0$ is generated in the clockwise direction, when the drawing is viewed from in front of the page. The orientation of this magnetic field $H_0$ is orthogonal to the direction of magnetization M1 in the first ferromagnetic metal layer 1. Therefore, the magnetic field $H_0$ applies a force in a direction to reverse the magnetization M1 of the first ferromagnetic metal layer 1.

The electric-current-generated magnetic field assist type spin-current-induced magnetization reversal element according to the present embodiment reverses the magnetization of the first ferromagnetic metal layer by a spin-orbit torque (SOT) effect due to a pure spin current that is generated by supplying an electric current to the spin-orbit torque wiring, and a magnetic field that is generated by supplying electric current to the electric-current-generated magnetic field assist wiring. The magnetization of the first ferromagnetic metal layer may be reversed by using the mechanism of either the SOT effect or the electric-current-generated magnetic field, or the magnetization may be reversed mainly by utilizing an electric-current-generated magnetic field and assisting the magnetization reversal by utilizing the SOT effect.

The electric-current-generated magnetic field assist type spin-current-induced magnetization reversal element according to the present embodiment is capable of magnetization reversal at low reversal current densities, and the rotation probability thereof can be made higher, by applying a magnetic field to the first ferromagnetic metal layer by means of the electric-current-generated magnetic field assist wiring.

Figure 2:
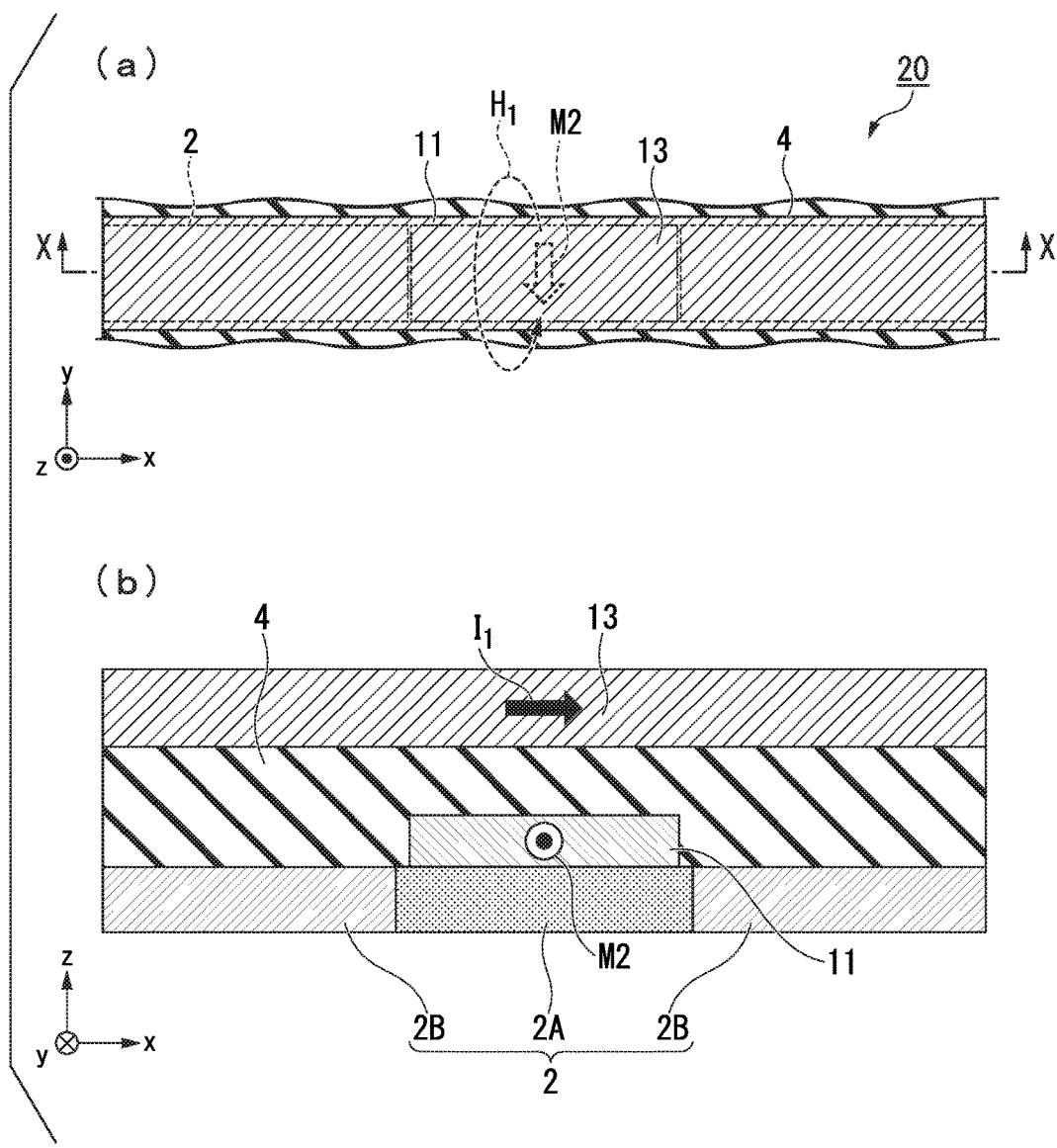
FIG. 2 illustrates schematic diagrams for explaining another embodiment of the electric-current-generated magnetic field assist type spin-current-induced magnetization reversal element according to the present invention, wherein (a) is a plan view and (b) is a section view.

FIG. 2 is a schematic diagram of an example of an electric-current-generated magnetic field assist type spin-current-induced magnetization reversal element according to another embodiment of the present invention. FIG. 2(a) is a plan view, and FIG. 2(b) is a section view cut along the line X-X, which is the center line, in the width direction, of the spin-orbit torque wiring 2 in FIG. 2(a). The elements denoted by the same reference numbers have configurations that are similar to those shown in FIG. 1, so their explanations will be omitted. In FIG. 2(a), as with FIG. 1(a), the first ferromagnetic metal layer 11 is indicated by a double-dotted chain line and the spin-orbit torque wiring 2 is indicated by a dashed line, in order to show the arrangement of the interior layers that cannot be seen in the plan view.

The electric-current-generated magnetic field assist type spin-current-induced magnetization reversal element 20 illustrated in FIG. 2 differs from the electric-current-generated magnetic field assist type spin-current-induced magnetization reversal element 10 illustrated in FIG. 1 in that the electric-current-generated magnetic field assist wiring 13 extends in the same direction as the direction of extension of the spin-orbit torque wiring 2, and in that the magnetization-easy axis of the first ferromagnetic metal layer 11 lies in a direction parallel to the y-axis.

In other words, in the electric-current-generated magnetic field assist spin-current-induced magnetization reversal element 20 illustrated in FIG. 2, the direction normal to the first ferromagnetic metal layer 11, i.e., the direction of stacking of the first ferromagnetic metal layer 11 and the spin-orbit torque wiring 2 (first direction), is parallel to the z-axis. The direction of extension of the spin-orbit torque wiring 2 (second direction) and the direction of extension of the electric-current-generated magnetic field assist wiring 13 (third direction) are both parallel to the x-axis. In other words, the electric-current-generated magnetic field assist type spin-current-induced magnetization reversal element 20 illustrated in FIG. 2 is an example wherein the direction of extension of the spin-orbit torque wiring 2 and the direction of extension of the electric-current-generated magnetic field assist wiring 13 are the same. The direction of stacking of the first ferromagnetic metal layer 1 and the spin-orbit torque wiring 2 is orthogonal to said direction.

In terms of the relationship between the direction of the magnetization-easy axis of the first ferromagnetic metal layer 11 and the direction of the electric current flowing in the spin-orbit torque wiring 2, the electric-current-generated magnetic field assist type spin-current-induced magnetization reversal element 20 illustrated in FIG. 2 corresponds to "type y" in Non-Patent Document 2.

In the electric-current-generated magnetic field assist type spin-current-induced magnetization reversal element 20 illustrated in FIG. 2, the magnetization M2 of the first ferromagnetic metal layer 11 is oriented in the −y direction. In other words, the direction of extension of the electric-current-generated magnetic field assist wiring 13 (third direction) is orthogonal to the direction of the magnetization-easy axis of the first ferromagnetic metal layer 11 (direction parallel to the x-axis).

In this case, by supplying an electric current $I_1$ from the −x direction towards the +x direction in the electric-current-generated magnetic field assist wiring 13 extending in the x direction, a magnetic field $H_1$ is generated in the clockwise direction as viewed from the −x direction towards the +x direction. This magnetic field $H_1$, in the first ferromagnetic metal layer 11, is oriented in the direction opposite to the magnetization M2 of the first ferromagnetic metal layer 11. For this reason, the magnetic field applies a force in a direction to reverse the magnetization M2 of the first ferromagnetic metal layer 11.

<Spin-Orbit Torque Wiring>

The spin-orbit torque wiring 2 illustrated in FIG. 1 and FIG. 2 extends in a second direction (direction parallel to the x-axis) in a plane orthogonal to the first direction (direction parallel to the z-axis), which is the direction normal to the first ferromagnetic metal layer 1, and adjoins the first ferromagnetic metal layer 1. In the spin-orbit torque wiring 2, the electric current flows in the direction of extension.

The spin-orbit torque wiring 2 comprises a material that generates a pure spin current due to the spin Hall effect when an electric current flows therethrough. The spin Hall effect is a phenomenon wherein a pure spin current in a direction orthogonal to the direction of the electric current is induced by spin-orbit interactions when an electric current flows through the material. It is sufficient for said material to have a composition wherein a pure spin current is generated in the spin-orbit torque wiring 2.

The spin-orbit torque wiring 2 illustrated in FIG. 1 and FIG. 2 comprises a pure spin current generation portion 2A that adjoins the first ferromagnetic metal layer 1 and a low resistance portion 2B comprising a material having a lower electrical resistance than the pure spin current generation portion 2A.

Figure 3:
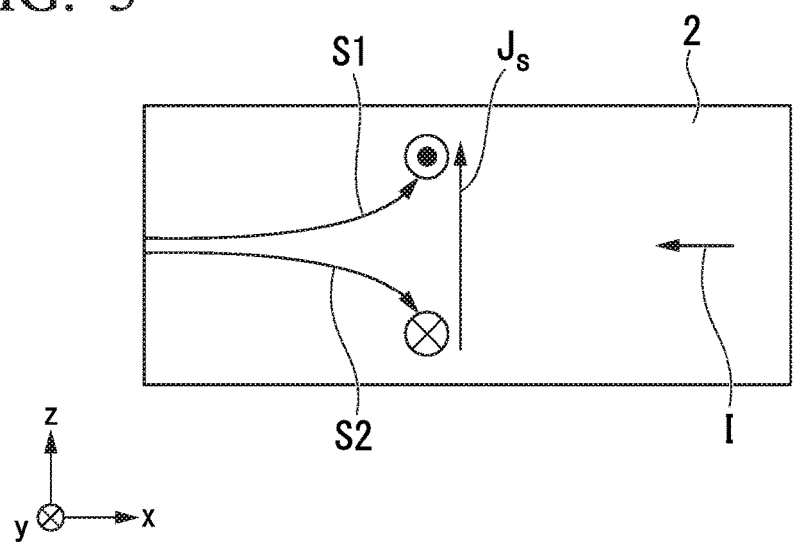
FIG. 3 is a schematic diagram for explaining the spin Hall effect.

FIG. 3 is a schematic diagram for explaining the spin Hall effect. FIG. 3 is a section view wherein the spin-orbit torque wiring 2 illustrated in FIG. 1 and FIG. 2 is cut along the x-direction. The mechanism whereby a pure spin current is generated by the spin Hall effect will be explained with reference to FIG. 3.

As illustrated in FIG. 3, when an electric current I flows along the direction of extension of the spin-orbit torque wiring, electrons having a first spin S1 oriented towards the front side of the page and electrons having a second spin S2 oriented towards the opposite side of the page are respectively deflected in directions orthogonal to the current. The normal Hall effect and the spin Hall effect are similar in that the direction of motion (movement) of (mobile) moving charges (electrons) is deflected, but they differ significantly in that, in the normal Hall effect, the directions of motion of charged particles moving in a magnetic field are deflected by Lorentz forces, whereas in the spin Hall effect, the directions of movement of the spin are deflected simply by the movement of the electrons (simply by the flow of electric current), even in the absence of a magnetic field.

In a non-magnetic body (a material that is not a ferromagnetic body), the number of electrons having the first spin S1 and the number of electrons having the second spin S2 are equal. Thus, in the drawing, the number of electrons of the first spin S1 that are deflected upwards is equal to the number of electrons of the second spin S2 that are deflected downwards. For this reason, the electric current, in terms of the net flux of electric charge, is zero. This type of spin current that is not accompanied by an electric current is called a pure spin current.

When an electric current is passed through a ferromagnetic body, electrons having the first spin S1 and electrons having the second spin S2 are deflected in opposite directions, in the same manner as explained above. However, the difference is that, in a ferromagnetic material, there are more electrons of either the first spin S1 or the second spin S2, as a result of which there is a net flux in the electric charge (a voltage is generated). Accordingly, the possible materials of the spin-orbit torque wiring 2 do not include materials consisting solely of a ferromagnetic body.

If the flow of electrons having the first spin S1 is represented by $J_\uparrow$, the flow of electrons having the second spin S2 is represented by $J_\downarrow$, and the spin current is represented by $J_S$, then $J_S = J_\uparrow - J_\downarrow$. In FIG. 3, the pure spin current $J_S$ flows in the upward direction in the drawing. Here, $I_S$ is a flow of electrons having 100% polarizability.

In FIG. 1, when a ferromagnetic body is brought into contact with the upper surface of the spin-orbit torque wiring 2, the pure spin current diffuses and flows into the ferromagnetic body. In other words, spin is injected into the first ferromagnetic metal layer 1.

The electric-current-generated magnetic field assist type spin-current-induced magnetization reversal element according to the present embodiment has a structure that is formed by joining spin-orbit torque wiring to the first ferromagnetic metal layer. For this reason, pure spin current that is generated by supplying an electric current to the spin-orbit torque wiring diffuses into the first ferromagnetic metal layer that is in contact with the spin-orbit torque wiring. This pure spin current creates a spin-orbit torque (SOT) effect, and contributes to magnetization reversal of the first ferromagnetic metal layer.

In the electric-current-generated magnetic field assist type spin-current-induced magnetization reversal element of the present embodiment, the electric current (hereinafter referred to as the "SOT reversal current") itself that flows in the spin-orbit torque wiring in order to make use of the SOT effect is a normal electric current involving the flow of electric charge, so Joule heat is generated by the flow of electric current.

In this case, heavy metals, which are materials that easily generate pure spin current, have a higher electrical resistivity than metals that are normally used as wiring.

For this reason, in order to reduce the Joule heat due to the SOT reversal current, it is more preferable for the spin-orbit torque wiring to have a part having low electrical resistivity rather than to consist entirely of a material that can generate pure spin current. In view thereof, it is preferable for the spin-orbit torque wiring in the electric-current-generated magnetic field assist type spin-current-induced magnetization reversal element according to the present embodiment to have a portion comprising a material that generates a pure spin current (pure spin current generation portion) and a portion comprising a material having a lower electrical resistivity than the pure spin current generation portion (low-resistance portion).

The pure spin current generation portion 2A may comprise any material as long as it can generate pure spin current. The pure spin current generation portion 2A, for example, may include a part that is composed of multiple materials.

The pure spin current generation portion 2A may comprise a material selected from the group consisting of tungsten, rhenium, osmium, iridium, and alloys containing at least one of these metals. Tungsten, rhenium, osmium and iridium have 5d electrons in the outermost shell, and when five of the d-orbitals are degenerate, they have a high orbital angular momentum. As a consequence, the spin-orbit interactions that cause the spin Hall effect become stronger, and spin current can be efficiently generated.

As the low-resistance portion 2B, it is possible to use materials that are normally used in wiring. For example, it is possible to use aluminum, silver, copper, gold or the like. The low-resistance portion 2B may comprise any material that has a lower electrical resistivity than the pure spin current generation portion 2A, and for example, may have a composition comprising material portions of multiple types.

Pure spin current may be generated in the low-resistance portion. In this case, the pure spin current generation portion and the low-resistance portion may be differentiated by assuming that portions comprising the materials that are described, in the present specification, as being materials for the pure spin current generation portion and the low-resistance portion, respectively, are the pure spin current generation portion and the low-resistance portion. Alternatively, it is possible to differentiate the low-resistance portion from the pure spin current generation portion as being a portion that is not the main portion that generates pure spin current, and in which the electrical resistivity is lower than that in the main portion.

The pure spin current generation portion 2A may include a non-magnetic heavy metal.

Here, a heavy metal refers to a metal having the specific gravity of yttrium or higher.

In this case, it is preferable for the non-magnetic heavy metal to be a non-magnetic metal having a high atomic number of at least 39 and having d-electrons or f-electrons in the outermost shell. Such non-magnetic metals have strong spin-orbit interactions that induce the spin Hall effect. The pure spin current generation portion 2A may consist solely of a non-magnetic metal having a high atomic number of at least 39 and having d-electrons or f-electrons in the outermost shell.

Normally, when an electric current flows through a metal, all of the electrons move in the direction opposite to the electric current, regardless of the direction of their spin. Conversely, non-magnetic metals having a high atomic number and having d-electrons or f-electrons in the outermost shell have strong spin-orbit interactions, so the direction of movement of electrons depends on the spin of the electrons due to the spin Hall effect, as a result of which pure spin current can be easily generated.

Assuming a case in which the low-resistance portion is composed of Cu (1.7 μ-Ω-cm), examples of materials that have an atomic number of at least 39 and that have an electrical resistivity at least twice as high as Cu include Y, Zr, Nb, Mo, Ru, Pd, Cd, La, Hf, Ta, W, Re, Os, Ir, Pt, Hg, Ce, Pr, Nd, Sm, Eu, Gd, Tb, Dy, Ho, Er, Tm, Yb and Lu.

When the pure spin current generation portion 2A includes a non-magnetic heavy metal, the pure spin current generation portion 2A should contain a limited amount of a heavy metal capable of generating a pure spin current. Furthermore, in this case, in the pure spin current generation portion, the concentration of the heavy metal capable of generating a pure spin current should be sufficiently lower than that of the main component of the pure spin current generation portion, or the heavy metal capable of generating a pure spin current should be the main component (e.g., at least 90%). In this case, the heavy metal capable of generating a pure spin current should preferably be, by 100%, a non-magnetic metal having a high atomic number of at least 39 and having d-electrons or f-electrons in the outermost shell.

In this case, a concentration for the heavy metal capable of generating a pure spin current that is sufficiently lower than that of the main component of the pure spin current generation portion refers, for example, to a heavy metal concentration, by molar ratio, of 10% or less in a pure spin current generation portion that is mainly composed of copper. When the main component constituting the pure spin current generation portion is a material other than the above-mentioned heavy metal, the concentration of the heavy metal contained in the pure spin current generation portion, by molar ratio, should preferably be 50% or less, and more preferably 10% or less. As long as the heavy metal concentration is within these ranges, the electron spin diffusion effect can be effectively obtained. If the heavy metal concentration is low, the main component will be a light metal having an atomic number smaller than that of the heavy metal. In this case, it is assumed that the heavy metal does not form an alloy with the light metal, but that atoms of the heavy metal are randomly scattered within the light metal. Since spin-orbit interactions are weak inside a light metal, it becomes difficult for a pure spin current to be generated by the spin Hall effect. However, when electrons pass through the heavy metal within the light metal, the spin is also scattered at the interfaces between the light metal and the heavy metal, so that a pure spin current can be efficiently generated even in regions in which the heavy metal concentration is low. If the heavy metal concentration exceeds 50%, the rate of the spin Hall effect becomes greater in the heavy metal, but the effect at the interfaces between the light metal and the heavy metal is decreased, so the effect is reduced overall. Therefore, a heavy metal concentration of a level for which sufficient interface effects can be expected is preferred.

The pure spin current generation portion 2A may include a magnetic metal. A magnetic metal refers to a ferromagnetic metal or to an anti-ferromagnetic metal. When a minute quantity of a magnetic metal is included in a non-magnetic metal, the spin-orbit interactions are enhanced, and the spin current generation efficiency relative to the electric current flowing in the pure spin current generation portion 2A can be raised. The pure spin current generation portion 2A may consist solely of an antiferromagnetic metal. Antiferromagnetic metals can provide effects that are equivalent to the case in which the heavy metal is 100% a non-magnetic metal having an atomic number of at least 39 and having a d-electrons or f-electrons in the outermost shell. The antiferromagnetic metal is preferably, for example, IrMn or PtMn, of which IrMn, which is stable with respect to heat, is more preferred.

Since spin-orbit interactions occur due to an interior field that is specific to the substance of the spin-orbit torque wiring material, a pure spin current will be generated even if a non-magnetic material is used. If a minute quantity of a magnetic metal is added to the spin-orbit torque wiring material, the magnetic metal itself scatters the electron spin, thereby raising the spin current generation efficiency. However, if too much of the magnetic metal is added, the generated pure spin current is scattered by the added magnetic metal, as a result of which the function of reducing the spin current becomes stronger. Therefore, the molar ratio of the added magnetic metal should preferably be sufficiently lower than the molar ratio of the main component of the pure spin generation portion 2A. As a rough guideline, it is preferable for the molar ratio of the added magnetic metal to be 3% or lower.

Additionally, the pure spin current generation portion 2A may include a topological insulator. The pure spin current generation portion 2A may consist solely of a topological insulator. A topological insulator is a substance in which the interior of the substance is an insulator or a high-resistance body, but the surface of the substance is in a metallic state with spin polarization. Some substances have something like an internal magnetic field, known as spin-orbit interactions. Even if an external magnetic field does not exist, a new topological phase is generated under the effects of the spin-orbit interactions. This is a topological insulator, which as a result of strong spin-orbit interactions and broken inversion symmetry at the edges, is able to generate a pure spin current with high efficiency.

As topological insulators, for example, SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$ are preferred. These topological insulators can generate spin current with high efficiency.

The electric-current-generated magnetic field assist type spin-current-induced magnetization reversal element according to the present embodiment may further comprise an insulating layer adjoining the surface of the spin-orbit torque wiring on the side opposite from the surface adjoined by the first ferromagnetic metal layer.

With this structure, when applied to a magnetoresistance effect element or to other uses, the electric current flowing through the spin-orbit torque wiring is prevented from leaking through the surface on the side opposite from the surface adjoining the first ferromagnetic metal layer, so the electric current concentration effect can be further enhanced.

For the above-described embodiment, only a case in which the spin-orbit torque wiring is directly connected to the first ferromagnetic metal layer was explained, but they may be connected via other layers, such as the capping layer explained below.

<First Ferromagnetic Metal Layer>

In the electric-current-generated magnetic field assist type spin-current-induced magnetization reversal element illustrated in FIG. 2, an in-plane magnetized film in which the magnetization direction of the first ferromagnetic metal layer is in the in-plane direction parallel to the layer is illustrated. However, it may alternatively be a perpendicularly magnetized film (FIG. 1) in which the magnetization direction is perpendicular to the layer.

In the electric-current-generated magnetic field assist type spin-current-induced magnetization reversal element illustrated in FIG. 1, the first ferromagnetic metal layer, in plan view, has shape anisotropy with the long axis in a second direction which is the direction of extension of the spin-orbit torque wiring.

Because the first ferromagnetic metal layer is long and narrow in this way, the magnetization is easily reversed in this direction (the lengthwise direction of the shape). For this reason, the magnetization reversal of the first ferromagnetic metal layer can be assisted even if the intensity of the electric-current-generated magnetic field of the electric-current-generated magnetic field assist wiring 3 is weak.

Figure 4:
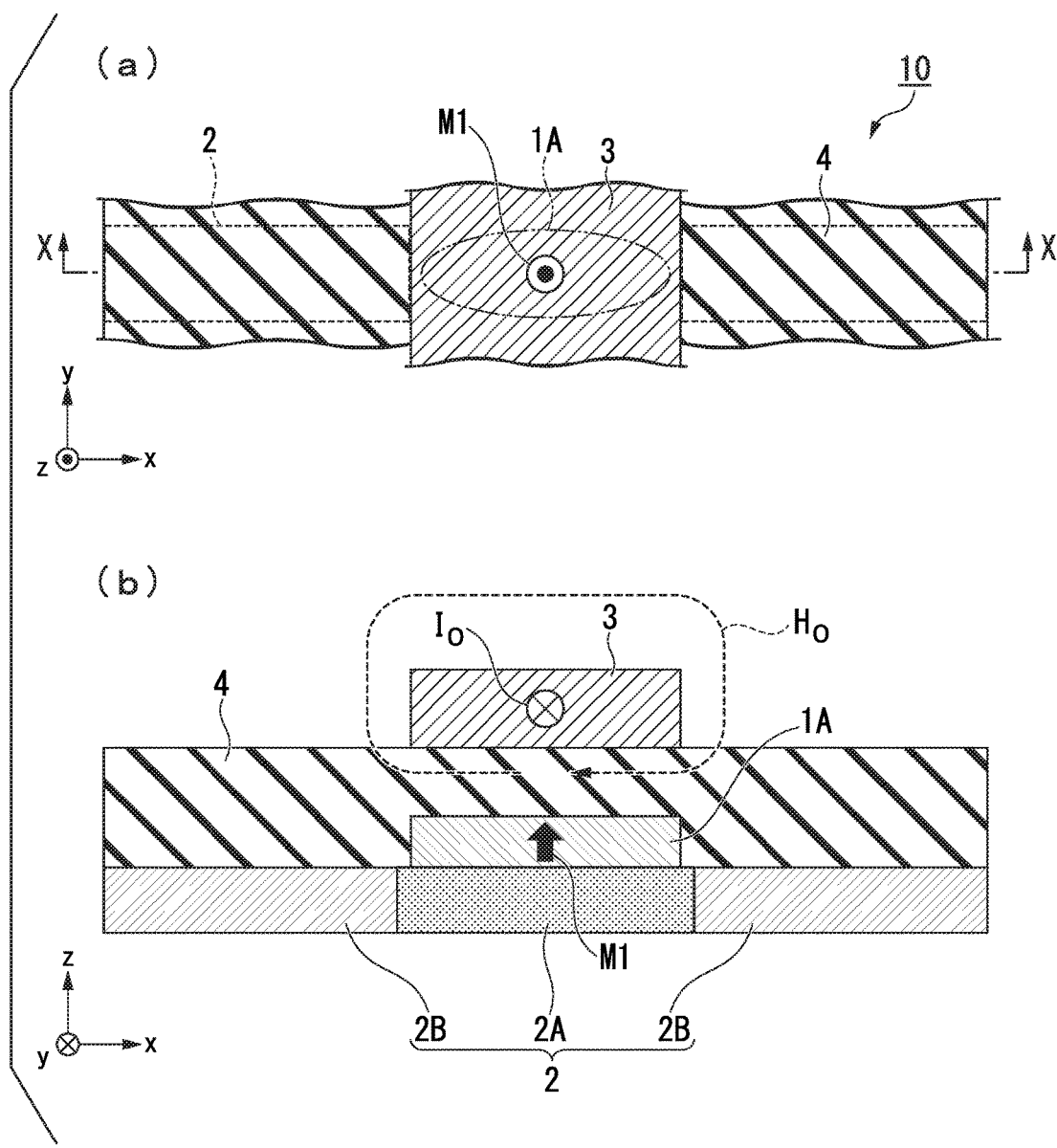
FIG. 4 illustrates schematic diagrams for explaining another embodiment of the electric-current-generated magnetic field assist type spin-current-induced magnetization reversal element according to the present invention, wherein (a) is a plan view and (b) is a section view.

In the electric-current-generated magnetic field assist type spin-current-induced magnetization reversal elements illustrated in FIG. 1 and FIG. 2, the first ferromagnetic metal layer is box-shaped (more precisely, rectangular) in plan view when viewed from the z-direction, but it may be elliptical as illustrated in FIG. 4 (first ferromagnetic metal layer 1A), or may further be another shape. This similarly applies to the other embodiments.

The first ferromagnetic metal layer will be explained in detail below.

The electric-current-generated magnetic field assist type spin-current-induced magnetization reversal elements illustrated in FIG. 1 and FIG. 2 are able to lower the resistance of the circuit overall by having a configuration in which the spin-orbit torque wiring 2 is provided with a low-resistance portion 2B.

<Electric-Current-Generated Magnetic Field Assist Wiring>

The electric-current-generated magnetic field assist wiring is arranged so as to be electrically insulated from the first ferromagnetic metal layer. In the electric-current-generated magnetic field assist wiring, an electric current flows for forming a magnetic field for promoting magnetization reversal of the first ferromagnetic metal layer.

The material of the electric-current-generated assist wiring is not particularly limited as long as it is a material having high electrical conductivity. For example, aluminum, silver, copper, gold or the like may be used.

The electric-current-generated magnetic field assist wiring preferably extends in a predetermined direction in a plane orthogonal to the first direction (z-direction). The magnetization-easy axis of the first ferromagnetic metal layer is generally oriented in the normal direction (z-direction) or the in-plane direction. For this reason, if the electric-current-generated magnetic field assist wiring extends in a plane orthogonal to the first direction (z-direction), it is easier to set the electric current amount necessary for forming a magnetic field in order to promote magnetization reversal of the first ferromagnetic metal layer.

In the electric-current-generated magnetic field assist type spin-current-induced magnetization reversal element 10 illustrated in FIG. 1, the electric-current-generated magnetic field assist wiring 3 extends in the y-direction in the x-y plane orthogonal to the z-direction. In the electric-current-generated magnetic field assist type spin-current-induced magnetization reversal element 20 illustrated in FIG. 2, the electric-current-generated magnetic field assist wiring 13 extends in the x-direction in the x-y plane orthogonal to the z-direction.

It is also possible to provide multiple lines of electric-current-generated magnetic field assist wiring.

In this case, the combined magnetic field of the electric-current-generated magnetic fields created by the electric current flowing through the multiple electric-current-generated magnetic field assist wiring lines function to reverse the magnetization of the first ferromagnetic metal layer.

The functions and effects of the electric-current-generated magnetic field assist type spin-current-induced magnetization reversal element according to the present embodiment will be explained in terms of the relationship to the discoveries reported in Non-Patent Document 2.

First, in the electric-current-generated magnetic field assist type spin-current-induced magnetization reversal element 10 illustrated in FIG. 1, the first ferromagnetic metal layer 1 is a perpendicularly magnetized film, and the direction of the magnetization-easy axis of the first ferromagnetic metal layer 1 and the direction of extension of the spin-orbit torque wiring 2 are orthogonal. In other words, the direction of the magnetization-easy axis of the first ferromagnetic metal layer 1 and the direction of flow of the electric current in the spin-orbit torque wiring 2 are orthogonal. In terms of the relationship between the direction of the magnetization-easy axis of the first ferromagnetic metal layer and the direction of the electric current flowing in the spin-orbit torque wiring, this configuration corresponds to "type z" in Non-Patent Document 2.

In "type z" in which the magnetization-easy axis is in the z-axis direction, the electric current (SOT reversal current density) that must be supplied to the spin-orbit torque wiring for magnetization reversal of the first ferromagnetic metal layer is said to be large. However, in the electric-current-generated magnetic field assist type spin-current-induced magnetization reversal element 10 illustrated in FIG. 1, it is possible to promote magnetization reversal of the first ferromagnetic metal layer 1 by means of a magnetic field $H_0$ formed by supplying an electric current to the electric-current-generated magnetic field assist wiring 3. As a result thereof, the SOT reversal current density that is supplied to the spin-orbit torque wiring can be reduced by an amount that is equivalent to the amount by which the magnetization reversal is assisted by the magnetic field $H_0$.

On the other hand, in the electric-current-generated magnetic field assist type spin-current-induced magnetization reversal element 20 illustrated in FIG. 2, the first ferromagnetic metal layer 11 is an in-plane magnetized film, and the direction of the magnetization-easy axis of the first ferromagnetic metal layer 11 and the direction of extension of the spin-orbit torque wiring 2 are orthogonal. In other words, the direction of the magnetization-easy axis of the first ferromagnetic metal layer 11 and the direction of flow of the electric current in the spin-orbit torque wiring 2 are orthogonal. In terms of the relationship between the direction of the magnetization-easy axis of the first ferromagnetic metal layer and the direction of the electric current flowing in the spin-orbit torque wiring, this configuration corresponds to "type y" in Non-Patent Document 2. In "type y", the electric current (SOT reversal current density) that must be supplied to the spin-orbit torque wiring for magnetization reversal of the first ferromagnetic metal layer is said to increase as the speed of the writing operation becomes faster. However, in the electric-current-generated magnetic field assist type spin-current-induced magnetization reversal element 20 illustrated in FIG. 2, it is possible to promote magnetization reversal of the first ferromagnetic metal layer 11 by means of a magnetic field formed by supplying an electric current to the electric-current-generated magnetic field assist wiring 13. As a result thereof, the SOT reversal current density that is supplied to the spin-orbit torque wiring can be reduced by an amount equivalent to the amount by which the magnetization reversal is assisted by the magnetic field $H_1$.

Figure 5:
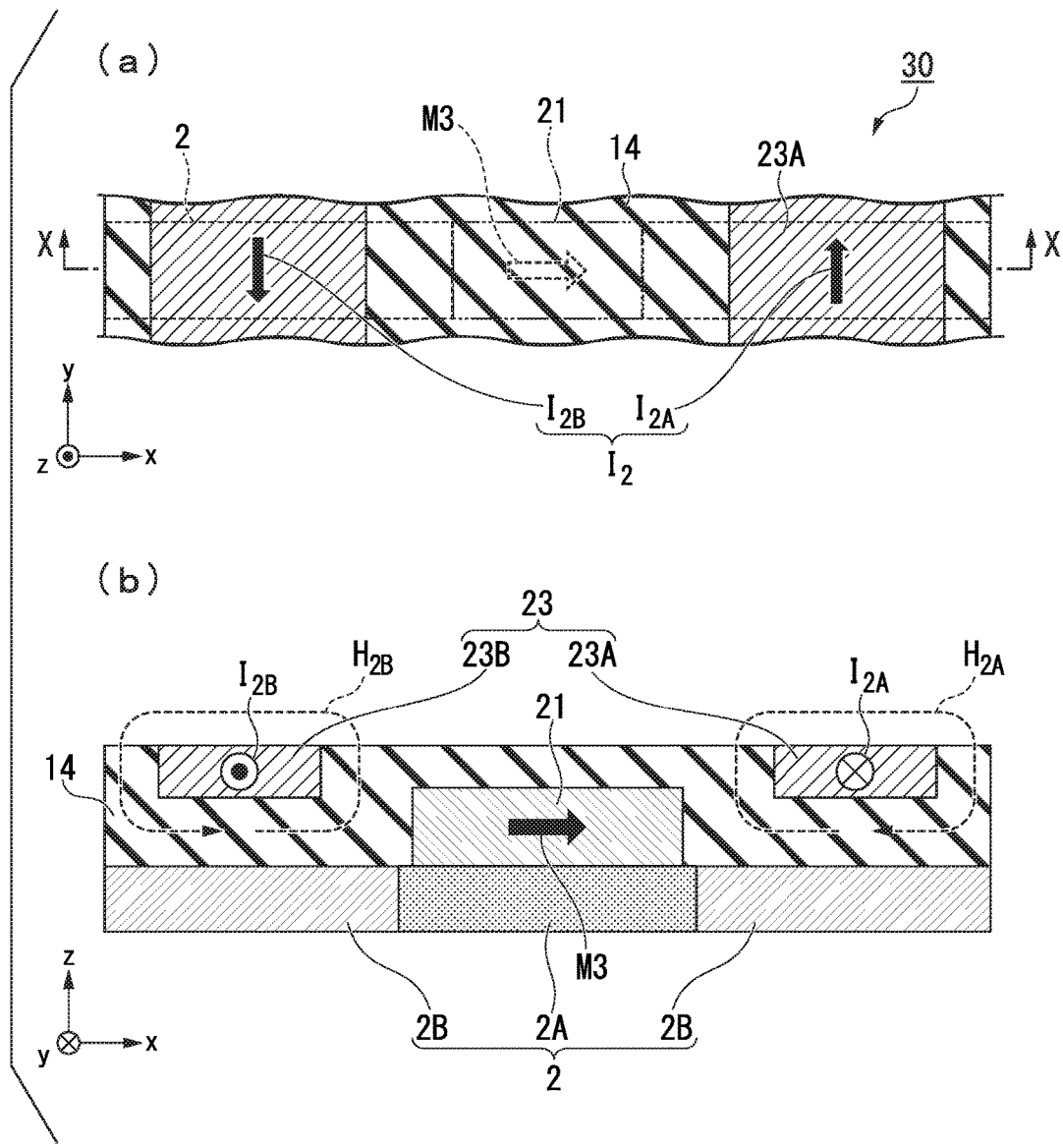
FIG. 5 illustrates schematic diagrams for explaining another embodiment of the electric-current-generated magnetic field assist type spin-current-induced magnetization reversal element according to the present invention, wherein (a) is a plan view and (b) is a section view.

FIG. 5 illustrates schematic diagrams for explaining an example of the electric-current-generated magnetic field assist type spin-current-induced magnetization reversal element according to another embodiment of the present invention. FIG. 5(a) is a plan view and FIG. 5(b) is a section view cut along the line X-X, which is the center line, in the width direction, of the spin-orbit torque wiring 2 in FIG. 5(a). The elements denoted by the same reference numbers have configurations that are similar to those shown in FIG. 1, so their explanations will be omitted. In FIG. 5(a), as with FIG. 1(a), the first ferromagnetic metal layer 21 is indicated by a double-dotted chain line and the spin-orbit torque wiring 2 is indicated by a dashed line, in order to show the arrangement of the interior layers that cannot be seen in the plan view.

The electric-current-generated magnetic field assist type spin-current-induced magnetization reversal element 30 illustrated in FIG. 5 comprises a first ferromagnetic metal layer 21 with a varying magnetization direction; spin torque wiring 2 that extends in a second direction in a plane orthogonal to the first direction, which is the direction normal to the first ferromagnetic metal layer 21, and that adjoins the first ferromagnetic metal layer 21; and electric-current-generated magnetic field assist wiring 23 (23A, 23B) that is arranged so as to be electrically insulated from the first ferromagnetic metal layer 21 by an insulating layer 4, and through which flows an electric current $I_2$ ($I_{2A}$, $I_{2B}$) for forming a magnetic field $H_0$ that assists in magnetization reversal of the first ferromagnetic metal layer 1.

The electric-current-generated magnetic field assist type spin-current-induced magnetization reversal element 30 illustrated in FIG. 5 differs from the electric-current-generated magnetic field assist type spin-current-induced magnetization reversal element 10 illustrated in FIG. 1 on the following three points. First, in terms of the relationship between the direction of the magnetization-easy axis of the first ferromagnetic metal layer 11 and the direction of the electric current flowing in the spin-orbit torque wiring 2, it corresponds to "type x" in Non-Patent Document 2. Second, two electric-current-generated magnetic field assist wiring lines are provided. Third, the electric-current-generated magnetic field assist wiring lines 23A, 23B extend in the y-axis direction and are arranged, in plan view, so as to sandwich the first ferromagnetic metal layer 21. In FIG. 5, the magnetic field generated by the electric current $I_{2A}$ flowing in the electric-current-generated magnetic field assist wiring 23A is $H_{2A}$ and the magnetic field generated by the electric current $I_{2B}$ flowing in the electric-current-generated magnetic field assist wiring 23B is $H_{2B}$.

In the electric-current-generated magnetic field assist type spin-current-induced magnetization reversal element 30 illustrated in FIG. 5, when an electric current $I_{2A}$ is supplied, from the −y direction towards the +y direction (from in front of the page through to the opposite side of the page in FIG. 5(b)), to the electric-current-generated magnetic field assist wiring 23A extending parallel to the y-axis, a magnetic field $H_{2A}$ is generated in the clockwise direction, when the drawing is viewed from in front of the page. Additionally, when an electric current $I_{2B}$ is supplied, from the +y direction towards the −y direction (from the opposite side of the page through to the front side of the page in FIG. 5(b)), to the electric-current-generated magnetic field assist wiring 23B extending parallel to the y-axis, a magnetic field $H_{2B}$ is generated in the counterclockwise direction, when the drawing is viewed from in front of the page. Due to the combined magnetic field of the magnetic field $H_{2A}$ and the magnetic field $H_{2B}$, formed at the position of the first ferromagnetic metal layer 21, a force is applied in a direction to reverse the magnetization M3 of the first ferromagnetic metal layer 1.

The embodiment illustrated in FIG. 5 is a case in which two electric-current-generated magnetic field assist wiring lines are provided, and electric current is applied to both simultaneously, but it is possible to have just one, or three or more, electric-current-generated magnetic field assist wiring lines. Additionally, it is possible to have a method of use in which electric current is applied to only one of the electric-current-generated magnetic field assist wiring lines, or a method of use in which electric current is applied with a time lag therebetween.

Figure 6:
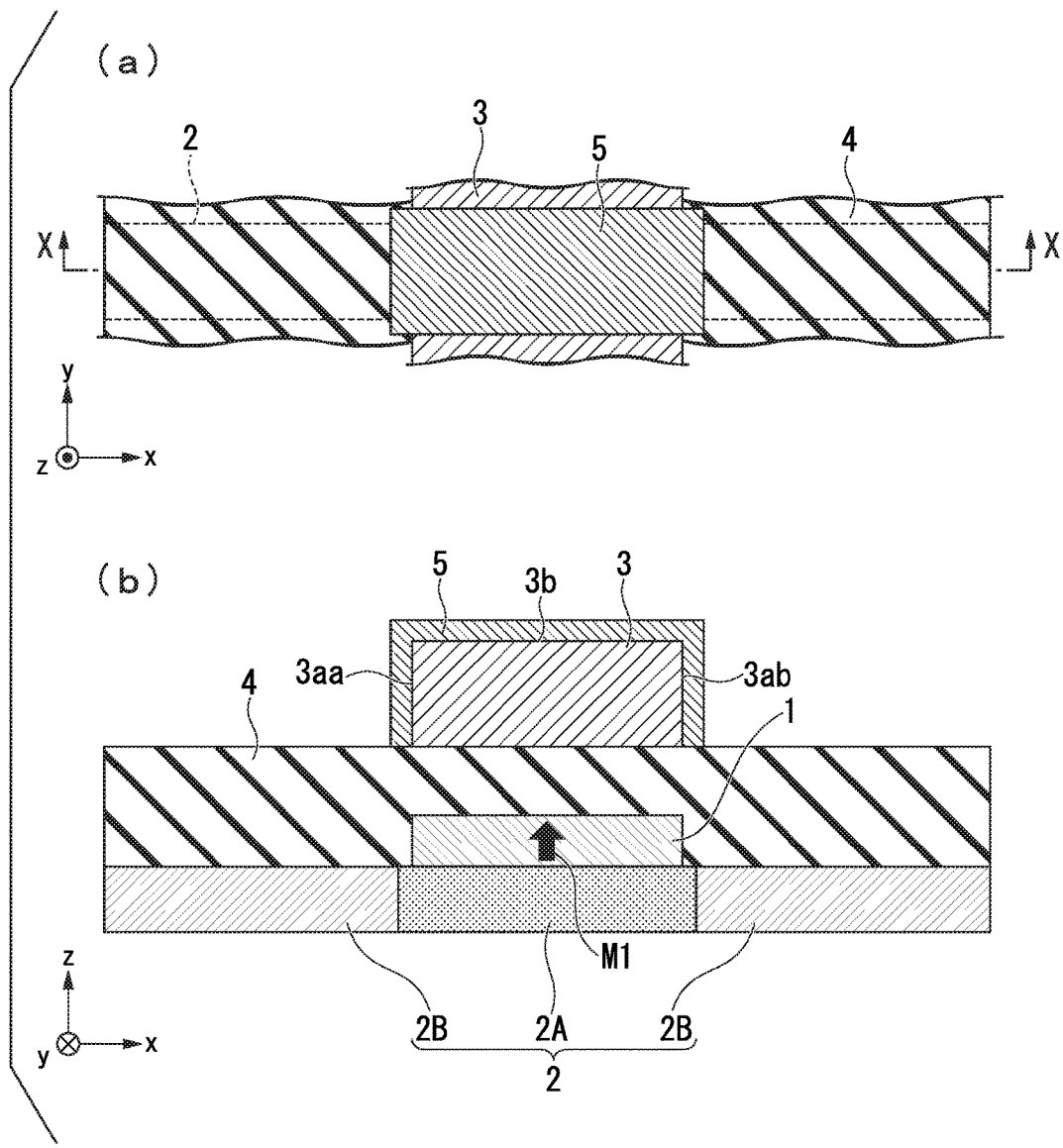
FIG. 6 illustrates schematic diagrams for explaining another embodiment of the electric-current-generated magnetic field assist type spin-current-induced magnetization reversal element according to the present invention, wherein (a) is a plan view and (b) is a section view.

FIG. 6 illustrates schematic diagrams for explaining an example of the electric-current-generated magnetic field assist type spin-current-induced magnetization reversal element according to another embodiment of the present invention. FIG. 6(a) is a plan view and FIG. 6(b) is a section view cut along the line X-X, which is the center line, in the width direction, of the spin-orbit torque wiring 2 in FIG. 6(a). The elements denoted by the same reference numbers have configurations that are similar to those shown in FIG. 1, so their explanations will be omitted.

The electric-current-generated magnetic field assist type spin-current-induced magnetization reversal element illustrated in FIG. 6 differs from the electric-current-generated magnetic field assist type spin-current-induced magnetization reversal element 10 illustrated in FIG. 1 in that the electric-current-generated magnetic field assist wiring 3 comprises a magnetic shield layer 5 on the side surfaces 3aa, 3ab and the surface 3b on the side not facing the first ferromagnetic metal layer 1.

The magnetic shield layer 5 has the function of preventing leakage, to the periphery, of the electric-current-generated magnetic field created by the electric current flowing in the electric-current-generated magnetic field assist wiring, and is typically a coating layer comprising a magnetic material. The magnetic shield layer 5 is formed with a configuration capable of effectively achieving this function.

By providing the magnetic shield layer 5, it is possible to suppress the application of undesired external magnetic fields to the first ferromagnetic metal layer, and to suppress interference of the enhancement of magnetization reversal in the first ferromagnetic metal layer 1 by the electric-current-generated magnetic field formed by the electric current flowing in the electric-current-generated magnetic field assist wiring 3. In devices (such as, for example, a magnetic memory as mentioned below) containing multiple electric-current-generated magnetic field assist type spin-current-induced magnetization reversal elements according to the present embodiment, it is possible, during writing, to effectively prevent the occurrence of cross-talk with electric-current-generated magnetic field assist type spin-current-induced magnetization reversal elements in other adjacent cells.

The electric-current-generated magnetic field assist type spin-current-induced magnetization reversal element according to the present embodiment may comprise a control device that controls the timing of electric current supplied to the electric-current-generated magnetic field assist wiring and the electric current supplied to the spin-orbit torque wiring.

For example, it is possible to provide a control device that implements control to supply an electric current to the spin-orbit torque wiring after supplying an electric current to the electric-current-generated magnetic field assist wiring. By implementing such control, the initial operations of magnetization reversal can be made faster.

Additionally, it is possible to provide a control device that implements control to stop supplying an electric current to the electric-current-generated magnetic field assist wiring after having stopped supplying an electric current to the spin-orbit torque wiring. By implementing such control, it is possible to end magnetization reversal, perform magnetization reversal in a predetermined direction, and end magnetization reversal.

If the supply of electric current to the spin-orbit torque wiring is stopped before the magnetization reversal of the spin is completed, then the spin loses the energy required for reversal during the process of magnetization reversal. In this case, the spin converges towards the magnetization-easy axis. Since magnetization reversal of spin occurs probabilistically, if the spin is only partially rotated, then there is a probability that the spin will return to the original state without undergoing magnetization reversal, under the influence of thermal energy or due to the relationship with the rotational phase of the spin. If a magnetic field is applied at this time, the spin will continue to rotate with the direction of application of the magnetic field as the quantization axis, and the magnetization reversal of the spin can be completed. In other words, according to said configuration, the probability of successfully reversing the magnetization of the spin is increased.

The electric-current-generated magnetic field assist type spin-current-induced magnetization reversal element according to the present embodiment can be produced by using a generally known film deposition technique such as sputtering and a shape processing technique such as photolithography or Ar ion milling.

Herebelow, the method for producing the electric-current-generated magnetic field assist type spin-current-induced magnetization reversal element 10 illustrated in FIG. 1 will be explained.

First, a pure spin current generation portion 2A can be deposited using, for example, a magnetron sputtering apparatus. After deposition of the pure spin current generation portion 2A, a resist or a protective film is provided at the parts where the electric-current-generated magnetic field assist type spin-current-induced magnetization reversal element is to be fabricated, and the unwanted parts are removed by ion milling or reactive ion etching (RIE).

Thereafter, the low-resistance portion 2B is deposited, and the pure spin current generation portion 2A is exposed by chemical mechanical polishing (CMP). Thereafter, a first ferromagnetic metal layer 1 is deposited, a resist or a protective film is provided, and milling is performed. Then, the first ferromagnetic metal layer 1 and the spin-orbit torque wiring 2 are processed to a predetermined shape.

Alternatively, the first ferromagnetic metal layer may be deposited and formed afterwards. After the pure spin current generation portion has been formed by the above-mentioned method, a low-resistance portion is deposited, and the spin-orbit torque wiring is processed into a predetermined shape. Thereafter, a flat surface may be obtained by chemical mechanical polishing (CMP), and the first ferromagnetic metal layer may be stacked thereon.

Then, an insulating layer 4 may be deposited, electric-current-generated magnetic field assist wiring may be deposited thereon, a resist or a protective film may be provided, and milling may be performed to form the shape of the electric-current-generated magnetic field assist wiring 3.

The shape of the first ferromagnetic metal layer may be freely fabricated by photolithography, as mentioned above. Additionally, when the planar shape of the first ferromagnetic metal layer 1 from the z-direction is rectangular as illustrated in FIG. 1 and FIG. 2, the first ferromagnetic metal layer 1 is processed twice. In other words, the process is divided into a first step of processing the first ferromagnetic metal layer in one direction, and a second step of processing the stacked body, after having been processed in the one direction, in another direction that intersects with the one direction.

On the other hand, when the first ferromagnetic metal layer 1A is elliptical as illustrated in FIG. 4, it is fabricated by making use of the relationship between the shape of a photomask and the processed shape. FIG. 9 is a diagram illustrating the correspondence between the shape of a photomask PM and the planar shape of the resulting first ferromagnetic metal layer 1, when viewed from the z-direction. As illustrated in FIG. 9($a$), even when the shape of one photomask PM is rectangular, the planar shape of the first ferromagnetic metal layer 1 becomes elliptical or the like. This is because some of the light that has passed through the photomask PM is diffused and cures the resist. Additionally, in etching processes such as ion milling, etching proceeds more easily in the areas forming corners.

When external regions A are to be formed outside an elliptical region E as illustrated in FIG. 9($c$), the photomask is shaped as illustrated in FIG. 9($b$) and FIG. 9($c$). The photomask PM1 illustrated in FIG. 9($b$) has a rectangular region Re in which the ellipse can be inscribed, and projecting regions Pr1 at the corners Ed of the rectangular region Re. Additionally, the photomask PM2 illustrated in FIG. 9($c$) has a rectangular region Re in which the ellipse can be inscribed, and projecting regions Pr2 on the long sides Sd of the rectangular region Re. The rectangular regions Re in FIGS. 9($b$) and ($c$) correspond to the photomask illustrated in FIG. 9($a$).

By providing projecting regions Pr1 at the corners Ed as illustrated in FIG. 9($b$), it is possible to delay the progress in the etching of the corners Ed during the etching process. As a result thereof, external regions A can be formed as illustrated in FIG. 9($c$). Additionally, by providing projecting regions Pr2 on the sides Sd as illustrated in FIG. 9($c$), the etching rate difference between the sides Sd and the corners Ed during the etching process can be made larger. As a result thereof, external regions A can be formed as illustrated in FIG. 9($c$). By securing the external regions A, the area of the first ferromagnetic metal layer 1 is made larger. If the area of the first ferromagnetic metal layer 1 is made larger, the stability of magnetization is raised and the occurrence of magnetization reversal due to thermal disturbances or the like can be avoided.

As another method, spot exposure can be performed by using light having directionality, such as a laser. For example, a negative resist is used, and light is shone only at the parts that are to be cured, thereby processing the resist into a predetermined shape. In this case as well, even if the shape of the spot that is exposed is rectangular, the resulting shape will be elliptical.

Figure 7:
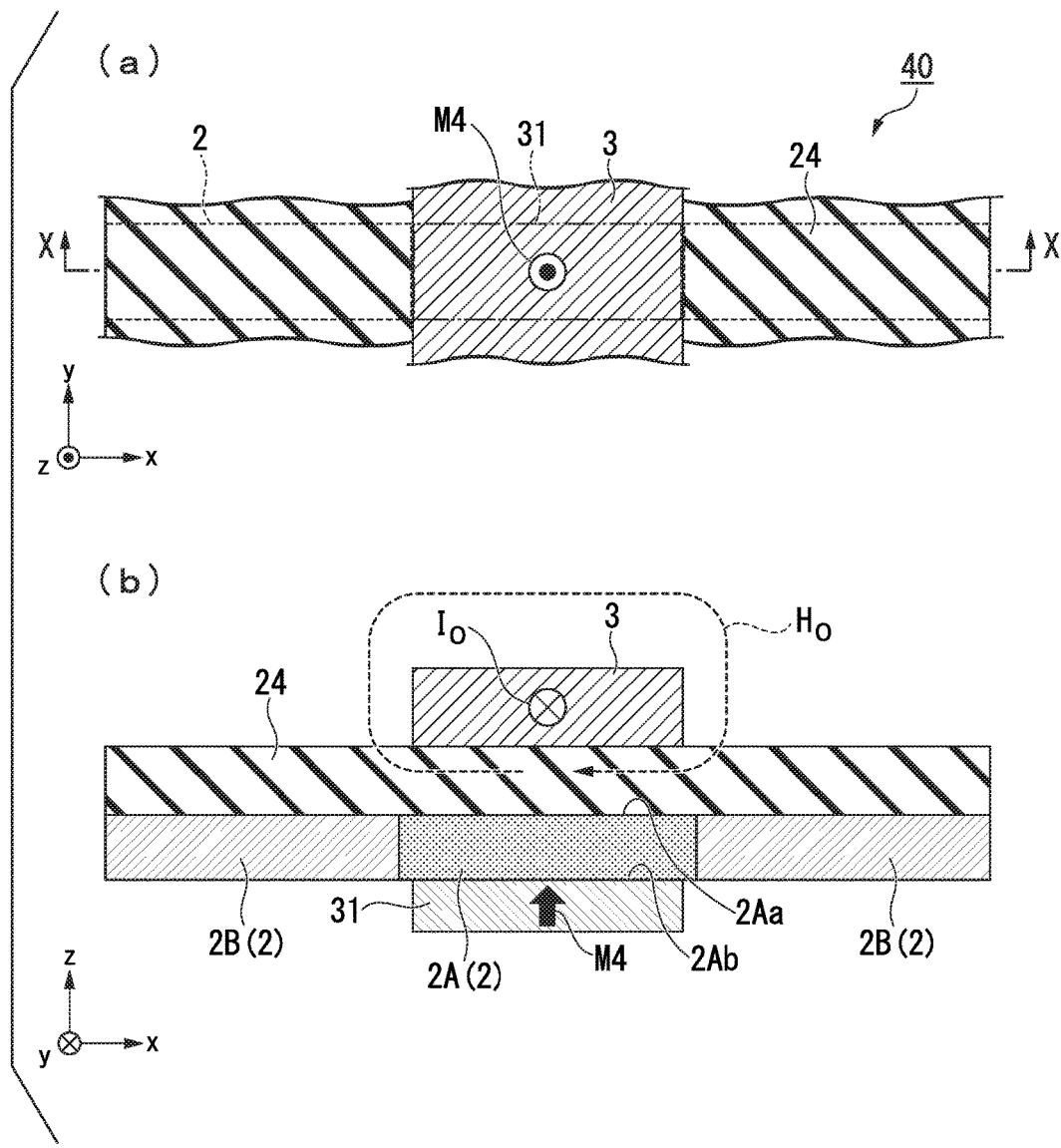
FIG. 7 illustrates schematic diagrams for explaining another embodiment of the electric-current-generated magnetic field assist type spin-current-induced magnetization reversal element according to the present invention, wherein (a) is a plan view and (b) is a section view.

FIG. 7 illustrates schematic diagrams for explaining an example of the electric-current-generated magnetic field assist type spin-current-induced magnetization reversal element according to another embodiment of the present invention. FIG. 7($a$) is a plan view and FIG. 7($b$) is a section view cut along the line X-X, which is the center line, in the width direction, of the spin-orbit torque wiring 2 in FIG. 7($a$). The elements denoted by the same reference numbers have configurations that are similar to those shown in FIG. 1, so their explanations will be omitted. In FIG. 7($a$), as with FIG. 1($a$), the first ferromagnetic metal layer 21 is indicated by a double-dotted chain line and the spin-orbit torque wiring 2 is indicated by a dashed line, in order to show the arrangement of the interior layers that cannot be seen in the plan view.

While the above-described electric-current-generated magnetic field assist type spin-current-induced magnetization reversal element has a configuration in which the spin-orbit torque wiring and the electric-current-generated magnetic field assist wiring are arranged so as to sandwich the first ferromagnetic metal layer, the electric-current-generated magnetic field assist type spin-current-induced magnetization reversal element illustrated in FIG. 7 has a configuration in which the spin-orbit torque wiring and the electric-current-generated magnetic field assist wiring are disposed on the same side of the first ferromagnetic metal layer.

In other words, in the electric-current-generated magnetic field assist type spin-current-induced magnetization reversal element 10 illustrated in FIG. 1, the first ferromagnetic metal layer 1 is formed on the surface 2Aa (see FIG. 7) on the side of the spin-orbit torque wiring 2 towards the electric-current-generated magnetic field assist wiring 3, and is arranged in the insulating layer 4. However, in the electric-current-generated magnetic field assist type spin-current-induced magnetization reversal element 40 illustrated in FIG. 7, the first ferromagnetic metal layer 31 is formed on the surface 2Ab on the side of the spin-orbit torque wiring 2 towards the electric-current generated magnetic field assist wiring 3.

In the electric-current-generated magnetic field assist type spin-current-induced magnetization reversal element 40 illustrated in FIG. 7, as compared to the electric-current-generated magnetic field assist type spin-current-induced magnetization reversal element illustrated in FIG. 1, the electric-current-generated magnetic field assist wiring 3 lies at a further distance from the first ferromagnetic metal layer, and thus, for the same amount of electric current, the influence of the electric-current-generated magnetic field on the magnetization reversal of the first ferromagnetic metal layer is smaller. Therefore, in order to reduce the level of decrease in the influence, the insulating layer 24 may be made thinner than the insulating layer 4.

As mentioned below, the electric-current-generated magnetic field assist type spin-current-induced magnetization reversal element according to the present embodiment can be applied to a magnetoresistance effect element. The applications are not limited to magnetoresistance effect elements, and other applications are possible. Examples of other applications include use in a spatial light modulator that spatially modulates incident light by making use of magneto-optic effects, by providing an electric-current-generated magnetic field assist type spin-current-induced magnetization reversal element, as described above, in each pixel, or replacement, with SOT, of magnetic fields applied to the magnetization-easy axes of magnets in a magnetic sensor in order to avoid hysteresis effects due to the magnetic coercive force of the magnets.

(Magnetoresistance Effect Element)

A magnetoresistance effect element according to an embodiment of the present invention comprises the electric-current-generated magnetic field assist type spin-current-induced magnetization reversal element as described above, a second ferromagnetic metal layer with a fixed magnetization direction, and a non-magnetic layer sandwiched between the first ferromagnetic metal layer and the second ferromagnetic metal layer.

Figure 8:
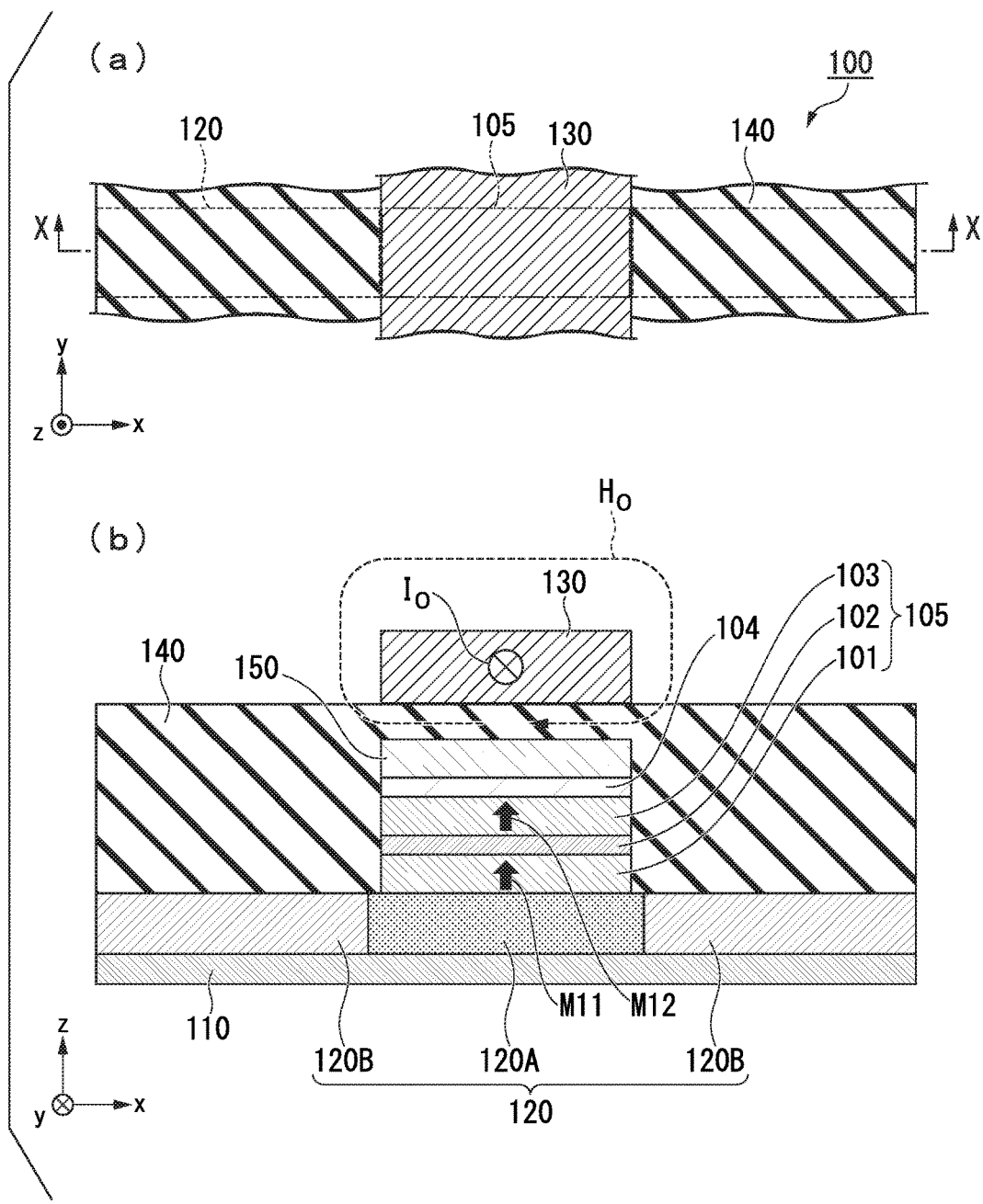
FIG. 8 illustrates schematic diagrams for explaining an embodiment of the magnetoresistance effect element according to the present invention, wherein (a) is a plan view and (b) is a section view.

FIG. 8 is an application example of the electric-current-generated magnetic field assist type spin-current-induced magnetization reversal element according to the present embodiment, showing schematic diagrams for an example of a magnetoresistance effect element which is also a magnetoresistance effect element according to an embodiment of the present application. FIG. 8(a) is a plan view and FIG. 8(b) is a section view cut along the line X-X, which is the center line, in the width direction, of the spin-orbit torque wiring 2 in FIG. 8(a). In FIG. 8(a), the magnetoresistance effect element 105 is indicated by a double-dotted chain line and the spin-orbit torque wiring 120 is indicated by a dashed line, in order to show the arrangement of the interior layers that cannot be seen in the plan view.

The magnetoresistance effect element 100 illustrated in FIG. 8 comprises the electric-current-generated magnetic field assist type spin-current-induced magnetization reversal element according to the present embodiment (the first ferromagnetic metal layer 101, the spin-orbit torque wiring 120 and the electric-current-generated magnetic field assist wiring 130), a second ferromagnetic metal layer 103 with a fixed magnetization direction, and a non-magnetic layer 102 sandwiched between the first ferromagnetic metal layer 101 and the second ferromagnetic metal layer 103. Additionally, the magnetoresistance effect element 100 illustrated in FIG. 8 may be considered to have a magnetoresistance effect element portion 105, spin-orbit torque wiring 120 and electric-current-generated magnetic field assist wiring 130.

The electric-current-generated magnetic field assist wiring 130 is electrically insulated by the magnetoresistance effect element portion 105 and the insulating layer 140.

In FIG. 8, a substrate 110 for fabricating the magnetoresistance effect element 100, wiring 150 for supplying an electric current in the stacking direction of the magnetoresistance effect element portion 105 and a capping layer 104 are also illustrated. The wiring 150 extends in the y-axis direction.

<Magnetoresistance Effect Element Portion>

The magnetoresistance effect element portion 105 has a second ferromagnetic metal layer 103 with a fixed magnetization direction, a first ferromagnetic metal layer 101 with a varying magnetization direction, and a non-magnetic layer 102 sandwiched between the second ferromagnetic metal layer 103 and the first ferromagnetic metal layer 101.

The magnetoresistance effect element portion 105 functions by having the magnetization of the second ferromagnetic metal layer 103 fixed in a single direction, while relatively changing the orientation of the magnetization of the first ferromagnetic metal layer 101. When applied to coercive force difference (pseudo spin valve) MRAM, the coercive force of the second ferromagnetic metal layer is made larger than the coercive force of the first ferromagnetic metal layer. When applied to exchange bias (spin valve) MRAM, the magnetization of the second ferromagnetic metal layer is fixed by exchange coupling with an antiferromagnetic metal layer.

When the non-magnetic layer 102 is formed from an insulator, the magnetoresistance effect element portion 105 is a tunneling magnetoresistance (TMR) element, whereas when the non-magnetic layer 102 is formed from a metal, the magnetoresistance effect element 102 is a giant magnetoresistance (GMR) element.

As the magnetoresistance effect element portion provided in the element according to the present embodiment, a generally known configuration can be used for the magnetoresistance effect element portion. For example, each layer may be composed of a plurality of layers, and the structure may also include other layers such as an antiferromagnetic metal layer for fixing the magnetization direction of the second ferromagnetic metal layer.

The second ferromagnetic metal layer 103 is also called a fixed layer or a reference layer, whereas the first ferromagnetic metal layer 101 is also called a free layer or a memory layer.

The second ferromagnetic metal layer 103 and the first ferromagnetic metal layer 101 may be in-plane magnetized films in which the magnetization direction is in the direction of a plane parallel to the layers, or may be perpendicularly magnetized films in which the magnetization direction is perpendicular to the layers.

In the example illustrated in FIG. 8, the second ferromagnetic metal layer 103 and the first ferromagnetic metal layer 101 are perpendicularly magnetized films, and the directions of magnetization are both parallel.

Generally known materials can be used as the material for the second ferromagnetic metal layer 103. For example, metals selected from the group consisting of Cr, Mn, Co, Fe and Ni, and alloys containing at least one of these metals and exhibiting ferromagnetism may be used. Further, alloys containing at least one of these metals and at least one element among B, C and N may also be used. Specific examples include Co—Fe and Co—Fe—B.

Additionally, in order to obtain a perpendicularly magnetized film, a multilayer film of $[Co/Pt]_n$ or the like, or an alloy such as FePt or $Mn_3Ga$ may be used. Furthermore, perpendicular magnetization may be achieved by magnetic anisotropy at the interface between the second ferromagnetic metal layer 103 and the adjoining metal or oxide film.

In order to achieve higher output, a Heusler alloy such as $Co_2FeSi$ is preferably used. Heusler alloys contain intermetallic compounds having a chemical composition of $X_2YZ$, wherein X is a noble metal element or a transition metal element belonging to the Co, Fe, Ni or Cu group of the periodic table, and Y is a transition metal belonging to the Mn, V, Cr or Ti group of the periodic table, or the elemental species of X, and Z is a typical element of group III to group V. Specific examples include $Co_2FeSi$, $Co_2MnSi$, and $Co_2Mn_{1-a}Fe_aAl_bSi_{1-b}$.

Additionally, in order to make the coercive force of the second ferromagnetic metal layer 103 larger with respect to the first ferromagnetic metal layer 101, an antiferromagnetic material such as IrMn or PtMn may be used as a material that contacts the second ferromagnetic metal layer 103. Furthermore, in order to ensure that magnetic field leakage from the second ferromagnetic metal layer 103 does not affect the first ferromagnetic metal layer 101, a structure having synthetic ferromagnetic coupling may be used.

Furthermore, in those cases where the orientation of the magnetization of the second ferromagnetic metal layer 103 is perpendicular to the stacking surface, a stacked film of Co and Pt is preferably used. Specifically, the structure of the second ferromagnetic metal layer 103 may be [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

For the material of the first ferromagnetic metal layer 101, a ferromagnetic material, and particularly a soft magnetic material, may be used. Examples of materials that can be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

Additionally, in order to obtain a perpendicularly magnetized film, a multilayer film of $[Co/Pt]_n$ or the like, or an alloy such as FePt or $Mn_3Ga$ may be used. Furthermore, perpendicular magnetization may be achieved by magnetic anisotropy at the interface between the first ferromagnetic metal layer 101 and the adjoining metal or oxide film.

When the orientation of the magnetization of the first ferromagnetic metal layer 101 is perpendicular to the stacked surface, the thickness of the first ferromagnetic metal layer is preferably at most 2.5 nm. At the interface between the first ferromagnetic metal layer 101 and the non-magnetic layer 102, the first ferromagnetic metal layer 101 may be provided with perpendicular magnetic anisotropy. Additionally, because the effect of the perpendicular magnetic anisotropy is attenuated as the thickness of the first ferromagnetic metal layer 101 is increased, it is preferable for the first ferromagnetic metal layer 101 to be thin.

Conventional materials can be used as the non-magnetic layer 102.

For example, when the non-magnetic layer 102 comprises an insulator (when it is a tunnel barrier layer), the material thereof may be $Al_2O_3$, $SiO_2$, MgO, $MgAl_2O_4$ or the like. Aside from these materials, materials in which a portion of the Al, Si or Mg has been substituted with Zn or Be or the like may also be used. Among the above materials, MgO and $MgAl_2O_4$ are materials that can achieve coherent tunneling, and therefore allow efficient injection of spin.

Additionally, when the non-magnetic layer 102 is formed from a metal, examples of materials that can be used include Cu, Au, Ag and the like.

As illustrated in FIG. 8, a capping layer 104 is preferably formed on the surface of the second ferromagnetic metal layer 103 opposite from the non-magnetic layer 102. The capping layer 104 is able to suppress the diffusion of elements from the second ferromagnetic metal layer 103. The capping layer 104 also contributes to the crystal orientation of each layer in the magnetoresistance element portion 105. As a result thereof, by providing a capping layer 104, it is possible to stabilize the magnetization of the second ferromagnetic metal layer 103 and the first ferromagnetic metal layer 101 of the magnetoresistance effect element portion 105, and to lower the resistance of the magnetoresistance effect element portion 105.

A material having high electrical conductivity is preferably used as the capping layer 104. For example, Ru, Ta, Cu, Ag, Au or the like may be used. The crystal structure of the capping layer 104 is preferably set as appropriate from among fcc structures, hcp structures or bcc structures, in accordance with the crystal structure of the adjacent ferromagnetic metal layer.

The capping layer 104 is preferably selected from the group consisting of silver, copper, magnesium and aluminum. While this shall be explained in detail below, when the spin-orbit torque wiring 120 and the magnetoresistance effect element portion 105 are connected via the capping layer 104, the capping layer 104 preferably does not allow the spin propagating from the spin-orbit torque wiring 120 to escape. It is known that, for silver, copper, magnesium, aluminum and the like, the spin does not tend to escape if the spin diffusion length is at least 100 nm.

The thickness of the capping layer 104 is preferably at most the spin diffusion length of the substance forming the capping layer 104. If the thickness of the capping layer 104 is at most the spin diffusion length, the spin propagating from the spin-orbit torque wiring 120 can be sufficiently transmitted to the magnetoresistance effect element portion 105.

<Substrate>

The substrate 110 preferably has excellent flatness. In order to obtain a surface having excellent flatness, a material such as, for example, Si, AlTiC or the like may be used.

A base layer (not illustrated) may be formed on the surface of the substrate 110 on the side towards the magnetoresistance effect element portion 105. By providing a base layer, it is possible to suppress the crystallinity, such as the crystal orientation and the crystal grain size, of each layer including the second ferromagnetic metal layer 103 stacked on the substrate 110.

The base layer preferably has insulating properties. This is in order to keep the electric current that flows in the spin-orbit torque wiring 120 or the like from escaping. Various types of base layers may be used.

For example, as one example, it is possible to use, as the base layer, a nitride layer that has a (001)-oriented NaCl structure and that contains at least one element selected from the group consisting of Ti, Zr, Nb, V, Hf, Ta, Mo, W, B, Al and Ce.

As another example, it is possible to use, as the base layer, a layer of a (002)-oriented perovskite conductive oxide represented by the compositional formula $XYO_3$. In this case, site X includes at least one element selected from the group consisting of Sr, Ce, Dy, La, K, Ca, Na, Pb and Ba, and site Y includes at least one element selected from the group consisting of Ti, V, Cr, Mn, Fe, Co, Ni, Ga, Nb, Mo, Ru, Ir, Ta, Ce and Pb.

As another example, it is possible to use, as the base layer, an oxide layer that has a (001)-oriented NaCl structure and that contains at least one element selected from the group consisting of Mg, Al and Ce.

As another example, it is possible to use, as the base layer, a layer that has a (001)-oriented tetragonal crystal structure or cubic crystal structure and that contains at least one element selected from the group consisting of Al, Cr, Fe, Co, Rh, Pd, Ag, Ir, Pt, Au, Mo and W.

Additionally, the base layer is not limited to being a single layer, and it is possible to stack a plurality of layers of the above-described examples. By improving the configuration of the base layer, it is possible to raise the crystallinity of each layer in the magnetoresistance effect element portion 105, thereby improving the magnetic properties.

<Wiring>

The wiring 150 is electrically connected to the second ferromagnetic metal layer 103 of the magnetoresistance effect element portion 105, and in FIG. 8, a closed circuit is formed by the wiring 150, the spin-orbit torque wiring 120 and a power supply (not illustrated), and electric current is supplied in the stacking direction of the magnetoresistance effect element portion 105.

The wiring 150 is not particularly limited as long as the material has high electrical conductivity. For example, aluminum, silver, copper, gold or the like may be used.

In the present embodiment as mentioned above, an example of a so-called top-pinned structure in which, in the magnetoresistance effect element 100, the second ferromagnetic metal layer 103 that is stacked later and that is disposed farther from the substrate 110 is a magnetization-fixed layer (pinned layer), and the first ferromagnetic metal layer 101 that is disposed closer to the substrate 110 is a free magnetization layer was described. However, the structure of the magnetoresistance effect element 100 is not limited to such a case, and may be a so-called bottom-pinned structure in which the second ferromagnetic metal layer 103, which is the magnetization-fixed layer (pinned layer), is disposed closer to the substrate 110.

The magnetoresistance effect element according to the present embodiment can be produced using a generally known method.

Herebelow, a method for producing the magnetoresistance effect element 100 illustrated in FIG. 8 will be explained.

The pure spin current generation portion 120A, the magnetoresistance effect element portion 105 and the capping layer 104 may, for example, be deposited using a magnetron sputtering apparatus. After depositing the pure spin current generation portion 120A, a resist or a protective film is provided, and the unneeded parts are removed by ion milling or reactive ion etching (RIE). Thereafter, the low-resistance portion 120B is deposited, then chemical mechanical polishing (CMP) is performed to expose the pure spin current generation portion 120A. After depositing the layers forming the magnetoresistance effect element, a resist or a protective film is provided at the parts where the magnetoresistance effect element is to be fabricated, and the unneeded parts are removed by ion milling or reactive ion etching (RIE).

Alternatively, the magnetoresistance effect element portion 105 and the capping layer 104 may be deposited and formed afterwards. The pure spin current generation portion is formed by the above-described method, after which the low-resistance portion is deposited and formed into the shape of the spin-orbit torque wiring, after which a flat surface may be provided by performing chemical mechanical polishing (CMP), and a magnetoresistance effect element portion 105 and a capping layer 104 may be stacked thereon.

Thereafter, the insulating layer 140 may be deposited, electric-current-generated magnetic field assist wiring 130 may be deposited thereon, a resist or a protective film may be provided thereon, and milling may be performed to form the shape of the electric-current-generated magnetic field assist wiring 130.

According to the magnetoresistance effect element of the present embodiment, magnetization can be reversed with a low reversal current density and a high rotation probability by applying, to the magnetoresistance effect element, a magnetic field generated by the electric-current-generated magnetic field assist wiring.

(Magnetic Memory)

A magnetic memory (MRAM) according to the present embodiment comprises multiple magnetoresistance effect elements according to the present embodiment.

By providing multiple electric-current-generated magnetic field assist wiring lines, it is possible to optimally adjust the magnitude and angle of the combined magnetic field.

In the magnetic memory (MRAM) according to the present embodiment, it is possible to provide the electric-current-generated magnetic field assist wiring, in plan view, between adjacent electric-current-generated magnetic field assist type spin-current-induced magnetization reversal elements.

When an electric-current-generated magnetic field is used for the assist effect, the magnetization is not reversed by the magnetic field alone. The number of wiring lines can be reduced by applying a magnetic field to two magnetoresistance effect elements using a single electric-current-generated magnetic field assist wiring line.

(High-Frequency Filter)

The high-frequency filter according to the present embodiment comprises a magnetoresistance effect element according to the present embodiment.

The high-frequency filter according to the present embodiment makes use of the spin-torque resonance phenomenon in the magnetoresistance effect element.

By applying a magnetic field using a predetermined magnetic field application means while simultaneously supplying an AC electric current to the magnetoresistance effect element, it is possible to induce spin-torque resonance in the magnetoresistance effect element, as a result of which the resistance value of the magnetoresistance effect element fluctuates periodically at a frequency corresponding to the spin-torque resonance frequency. The spin-torque resonance frequency of the magnetoresistance effect element changes depending on the magnitude of the magnetic field applied to the magnetoresistance effect element, and the resonance frequency thereof is generally in a high frequency band of a few GHz to several tens of GHz.

REFERENCE SIGNS LIST 1, 1A, 11, 21, 31 First ferromagnetic metal layer
2 Spin-orbit torque wiring
2A Pure spin current generation portion
2B Low-resistance portion 3, 13, 23, 23A, 23B Electric-current-generated magnetic field assist wiring
4, 14, 24 Insulating layer
5 Magnetic shield layer
10, 20, 30, 40 Electric-current-generated magnetic field assist type spin-current-induced magnetization reversal element
100 Magnetoresistance effect element
101 First ferromagnetic metal layer
102 Non-magnetic layer
103 Second ferromagnetic metal layer
105 Magnetoresistance effect element portion
120 Spin-orbit torque wiring
120A Pure spin current generation portion
120B Low-resistance portion
130 Electric-current-generated magnetic field assist wiring
140 Insulating layer
150 Wiring

What is claimed is:

1. An electric-current-generated magnetic field assist type spin-current-induced magnetization reversal element comprising:
   a first ferromagnetic metal layer with a varying magnetization direction;
   spin-orbit torque wiring that (1) adjoins the first ferromagnetic metal layer, (2) extends in a second direction in a plane orthogonal to a first direction normal to the first ferromagnetic metal layer and (3) comprises a pure spin current generation portion and low resistance portion; and
   electric-current-generated magnetic field assist wiring that is arranged so as to be electrically insulated from the first ferromagnetic metal layer and in which flows an electric current for forming a magnetic field that assists magnetization reversal of the first ferromagnetic metal layer: wherein:
   the spin-orbit torque wiring is configured to reverse the magnetization direction of the first ferromagnetic layer by inducing spin orbit torque in the first ferromagnetic layer;
   the pure spin current generation portion adjoins the first ferromagnetic metal layer and is capable of reversing the magnetization direction of the first ferromagnetic layer by inducing the spin orbit torque in the first ferromagnetic layer; and
   the low resistance portion comprises a material having a lower electrical resistance than the pure spin current generation portion.

2. The electric-current-generated magnetic field assist type spin-current-induced magnetization reversal element according to claim 1, wherein the electric-current-generated magnetic field assist wiring extends in a third direction in a plane orthogonal to the first direction.

3. The electric-current-generated magnetic field assist type spin-current-induced magnetization reversal element according to claim 2, wherein the direction of extension of the electric-current-generated magnetic field assist wiring extends orthogonal or parallel to the direction of extension of the spin-orbit torque wiring.

4. The electric-current-generated magnetic field assist type spin-current-induced magnetization reversal element according to claim 3, wherein the direction of extension of the spin-orbit torque wiring is orthogonal to a direction of a magnetization-easy axis of the first ferromagnetic metal layer.

5. The electric-current-generated magnetic field assist type spin-current-induced magnetization reversal element according to claim 4, wherein the direction of the magnetization-easy axis of the first ferromagnetic metal layer is the direction normal thereto.

6. The electric-current-generated magnetic field assist type spin-current-induced magnetization reversal element according to claim 1, wherein the first ferromagnetic metal layer, in plan view, has shape anisotropy such that a long axis is oriented in the second direction, which is the direction of extension of the spin-orbit torque wiring.

7. The electric-current-generated magnetic field assist type spin-current-induced magnetization reversal element according to claim 1, wherein the electric-current-generated magnetic field assist wiring comprises a magnetic shield layer on a side surface and/or a surface on a side not facing the first ferromagnetic metal layer.

8. The electric-current-generated magnetic field assist type spin-current-induced magnetization reversal element according to claim 1, comprising a plurality of lines of the electric-current-generated magnetic field assist wiring.

9. The electric-current-generated magnetic field assist type spin-current-induced magnetization reversal element according to claim 1, comprising a control device that implements control so as to supply an electric current to the spin-orbit torque wiring after supplying an electric current to the electric-current-generated magnetic field assist wiring.

10. The electric-current-generated magnetic field assist type spin-current-induced magnetization reversal element according to claim 1, comprising a control device that implements control so as to stop supplying an electric current to the electric-current-generated magnetic field assist wiring after having stopped supplying an electric current to the spin-orbit torque wiring.

11. A magnetoresistance effect element comprising the electric-current-generated magnetic field assist type spin-current-induced magnetization reversal element according to claim 1, a second ferromagnetic metal layer with a fixed magnetization direction, and a non-magnetic layer sandwiched between the first ferromagnetic metal layer and the second ferromagnetic metal layer.

12. A magnetic memory comprising a plurality of magnetoresistance effect elements according to claim 11.

13. The magnetic memory according to claim 12, wherein the electric-current-generated magnetic field assist wiring, in plan view, is provided between adjacent electric-current-generated magnetic field assist type spin-current-induced magnetization reversal elements.

14. A high-frequency filter comprising the magnetoresistance effect element according to claim 11.

15. The electric-current-generated magnetic field assist type spin-current-induced magnetization reversal element according to claim 1, wherein the spin-orbit torque wiring comprises a non-magnetic metal having a high atomic number of at least 39 and having d-electrons or f-electrons in the outermost shell.

16. The electric-current-generated magnetic field assist type spin-current-induced magnetization reversal element according to claim 1, wherein the pure spin current generation portion comprises a non-magnetic metal having a high atomic number of at least 39 and having d-electrons or f-electrons in the outermost shell.

* * * * *